United States Patent [19]

Buenzli, Jr. et al.

[11] Patent Number: 5,157,668
[45] Date of Patent: Oct. 20, 1992

[54] METHOD AND APPARATUS FOR LOCATING FAULTS IN ELECTRONIC UNITS

[75] Inventors: Charles W. Buenzli, Jr., Wexford; Ravi Rastogi, Coraopolis; Kenneth F. Sierzega, Pittsburgh; Maurice M. Tayeh, Mars, all of Pa.

[73] Assignee: Applied Diagnostics, Inc., Pittsburgh, Pa.

[21] Appl. No.: 375,839

[22] Filed: Jul. 5, 1989

[51] Int. Cl.$^5$ .............................................. G06F 11/00
[52] U.S. Cl. .................................... 371/15.1; 371/23; 364/489
[58] Field of Search ................. 371/15.1, 23; 364/513, 364/200 MS File, 900 MS File, 488, 489, 490; 324/158 R

[56] References Cited

U.S. PATENT DOCUMENTS

| | | | |
|---|---|---|---|
| 4,242,751 | 12/1980 | Henckels et al. | 371/26 |
| 4,459,695 | 7/1984 | Barratt et al. | 371/25 |
| 4,591,938 | 5/1986 | Bennett et al. | 364/403 |
| 4,613,940 | 9/1986 | Shenton et al. | 364/490 |
| 4,635,208 | 1/1987 | Coleby et al. | 364/491 |
| 4,651,284 | 3/1987 | Watanabe et al. | 364/491 |
| 4,709,366 | 11/1987 | Scott et al. | 371/20 |
| 4,766,595 | 8/1988 | Gollomp | 371/23 |
| 4,791,357 | 12/1988 | Hyduke | 371/25 |
| 4,827,428 | 5/1989 | Dunlop | 364/489 X |

OTHER PUBLICATIONS

Reasoning Based On Structure And Behavior; Randall Davis.
Troubleshooting: when modeling is the trouble; Philippe Dague and Oliver Raiman; Engineering Problem Solving, pp. 600-605.
Dedale: An Expert System For Troubleshooting Analogue Circuits, Philippe Deves, Jean-Pierre Marx, Olier Raiman; 1987 International Test Conference; Paper 24.2, pp. 586-594.
In-Ate ™ : Fault Diagnosis as Expert System Guided Search Richard R. Cantone, W. Brent Lander, Michael P. Marrone and Michael W. Gaynor; Automated Reasoning Corporation.
ExperTest ® The Intelligent Test Solution; Array Analysis Engineering and Scientific Instrumentation.
Personal Engineering And Instrumentation News: Enhancing Engineering Productivity With Desktop Computers, May 1988.

(List continued on next page.)

Primary Examiner—Robert W. Beausoliel
Attorney, Agent, or Firm—Bell, Seltzer, Park & Gibson

[57] ABSTRACT

An artificial intelligence based method and apparatus for locating faults in electronic units includes a technique for modelling electronic units in terms of behavioral constraints. Behavioral constraints model circuit components in terms of changes in outputs thereof which result from changes in inputs thereto. These changes, referred to as "phase changes" may be supplemented by gain and compliance constraints to model an electronic unit at all functional abstraction or hierarchical decomposition levels thereof. In addition to providing a universal modelling scheme, behavioral constraint relationships provide a highly accurate indication of subtle changes in a circuit, for accurate fault location or troubleshooting.

Troubleshooting takes place by applying a predetermined search strategy on the electronic unit which is represented by behavioral constraints. The search strategy begins with a top down search. When a faulty block is found, the search moves down one functional abstraction level and searches the next lower level block having an output corresponding to the output of the higher level block. If the next lower level block is not defective, adjacent blocks at the next lower level are searched.

Testing of the electronic unit is begun according to the functional test plan specified for the unit. Each functional test in the functional test plan is associated with one or more blocks at a functional abstraction level. When a functional test fails, troubleshooting begins at the block and functional abstraction level corresponding to the failed functional test.

114 Claims, 15 Drawing Sheets

OTHER PUBLICATIONS

Computer Aided Production Engineering; Cape Systems, Inc.
TestBench TM Software; Texas Instruments; Knowledge-based diagnostic and Repair Solution for Complex Problems.
Interactions, vol. 3, No. 8, May 1988.
Synergist-A Schematic Capture And Fault Diagnosis System; Robert Milne Intelligent Applications Ltd. Kirkton Business Centre, Livingston Village West Lothian, Scotland, EH54 7 AY.
Synergist-A Fault Diagnosis And Schematic Capture System; Intelligent Applications (USA).
Expert Systems Strategies; Editor: Paul Harmon; vol. 2, No. 8, Aug., 1986 pp. 1-27.

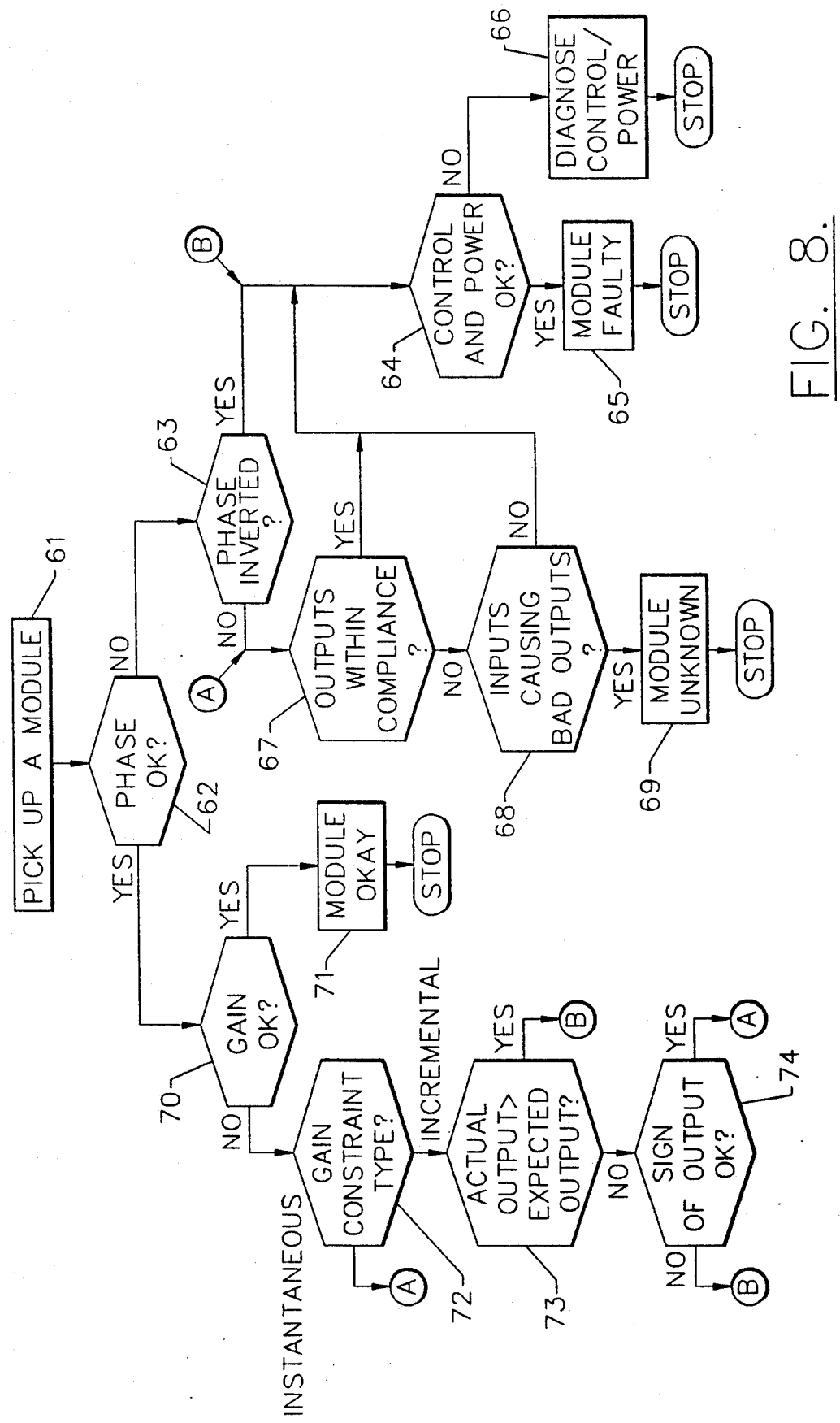

```
TECHNICIAN MODE

TEST NUMBER:        4.1.3
TEST TYPE:          ONE OF: <DC,AC,SPECIFIC
                    N2: 3.5v, N3: 5.6v
TEST DATA:          OR
                    TEST-DATA-4.1.1
TEST DESCRIPTION:   <OPTIONAL>
                    "CHECKS OVERALL GAIN OF THE CHANNEL
                    FOR DIFFERENT DAC GAIN WORDS"
MODULE TESTED:      <DEFAULT: S&H HYBRID>
                    OR
                    OUTPUT AMPLIFIER
TEST SETUP:         PIN 20: 0.3v,    PIN 30: 4.5v
                    PIN 31: 2.1v,    PIN 12: 12v
MEASUREMENT         MEASURE 0 V AT OUTPUT PIN (PIN 20)
INSTRUCTIONS:
```

FIG. 9a.

```
ATE MODE

TEST NUMBER:        4.1.3
TEST TYPE:          ONE OF: <DC,AC,SPECIFIC
                    N2: 3.5v, N3: 5.6v
TEST DATA:          OR
                    TEST-DATA-4.1.1
TEST DESCRIPTION:   <OPTIONAL>
                    "CHECKS OVERALL GAIN OF THE CHANNEL
                    FOR DIFFERENT DAC GAIN WORDS"
MODULE TESTED:      <DEFAULT: S&H HYBRID>
                    OR
                    OUTPUT AMPLIFIER
```

FIG. 9b.

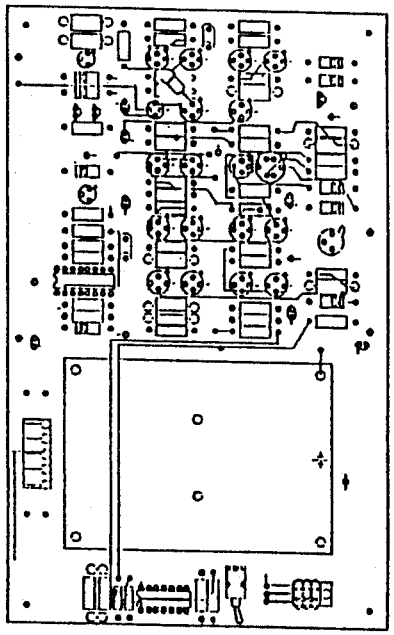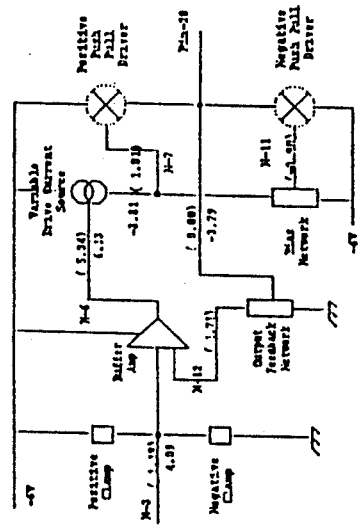
FIG. 11c.

FIG. 11d.

METHOD AND APPARATUS FOR LOCATING FAULTS IN ELECTRONIC UNITS

FIELD OF THE INVENTION

This invention relates to the testing of complex electronic units and more particularly to a computer based method and apparatus for fault location or isolation in an electronic unit.

BACKGROUND OF THE INVENTION

In the present state of the art, electronic units, for example circuit boards, circuit cards or hybrids, are becoming increasingly complex, with many electronic components being densely packed thereon. As a consequence, it has become increasingly difficult to locate a fault in a defective unit to permit repair or replacement of the faulty component. With today's high cost of labor, it often becomes more economical to discard a faulty unit rather than attempting to locate and repair a fault thereon. However, for expensive electronic units, such as those employed in the aerospace or defense industries, the value of an individual unit is sufficiently high such that it cannot be discarded if found to be defective. As such, techniques for locating faults in complex electronic units are necessary.

In order to be effective, a fault locating system (often referred to as a "troubleshooting system"), must accurately isolate faults to a particular component, or a small number of components at the Line Replaceable Unit (LRU) level. Moreover, faults must be located quickly so that faulty units may be repaired quickly. Finally, an effective fault isolation technique should require a minimum number of measurements (often referred to as nodes probed) on a defective unit because probing is difficult for tightly packed units and because probing may damage a component.

As a result of this long felt need, many sophisticated troubleshooting systems have been proposed and a few have even been commercialized. However, prior art troubleshooting systems have had many shortcomings. One type of troubleshooting system employs a large number of test patterns which are applied to the inputs of an electronic unit in order to determine the location of a faulty component. In response to each test pattern the outputs are compared with expected outputs, to thereby isolate or at least localize a fault. It will be recognized that such test pattern techniques are extremely time consuming because many test patterns must be applied in order to locate a fault. Moreover, a large set of test patterns must be generated and tested for effectiveness in locating possible faults. Custom test patterns are required for each different unit to be tested, thereby greatly increasing the cost of testing.

Another type of system employs "fault dictionaries" in which all possible failures in a unit are described. This "fault dictionary" may then be employed to troubleshoot a circuit. Unfortunately, the generation of a fault dictionary for complex units is extremely time consuming. Attempts have been made to modify the fault dictionary technique to reduce the complexity thereof. See for example U.S. Pat. No. 4,242,751 to Henckels, et al. entitled *Automatic Fault-Probing Method And Apparatus For Checking Electrical Circuits And The Like*, in which an automated troubleshooting system combines fault dictionaries and probe tracking approaches to produce a look ahead computer guided smart probe. A failure prediction is made and the probe is guided to the predicted point. If this point is in fact defective, the failure is tracked, based on the circuit schematic, to make a more accurate prediction. The combination of predicting bad points and tracking bad points is employed to cause the probe to finally isolate the fault.

Yet another troubleshooting approach employs probabilistic methods to provide an indication of which components are likely to fail. Thus, a probabalistic belief of failure is associated with each component. Probabilistic models as described above presume the existence of a data base of likely failures. However, when testing the initial group of failed units there is no sample set from which likely to fail components may be generated. Moreover, for high cost low volume units which may be employed in aerospace and defense applications, an insufficient number of units may be produced to obtain statistical data on likelihood of failure. Finally, probabilities of failure for components may change as manufacturing quality improvements invalidate statistical data. Accordingly, probabilistic methods have been found to be of limited success.

Recently, troubleshooting systems have been proposed which employ artificial intelligence techniques to model the behavior of a human troubleshooter. Artificial intelligence based troubleshooting systems often employ known test pattern and probabilistic models. See for example U.S. Pat. No. 4,766,595 to Gollomp entitled *Fault Diagnostic System Incorporating Behavior Models* which discloses a combination of artificial intelligence, shallow reasoning and deep reasoning techniques for failure analysis. Shallow reasoning is a symptom-based approach in which known test failures are used as a predictor of likely present failures. Deep reasoning is a schematic based approach based on circuit topology. According to the '595 patent, a statistical criticality table is calculated which orders the effects of critical components in terms of probability of occurrence. Unfortunately, as described above, such systems are not effective for low volume units or the first defective samples of high volume units, before statistical failure data is accumulated.

Artificial intelligence-based troubleshooting systems have also proposed using reasoning based upon the circuit schematic to locate a fault. These systems typically decompose the circuit schematic into higher level functional blocks, with the lowest level or primitive blocks being models for physical components such as transistors or resistors. Models for a few components have been proposed; however, these systems have not heretofore been applied to real world highly dense electronic units having many different components. Examples of artificial intelligence based troubleshooting systems will now be described.

In an article by Davis entitled *Reasoning Based on Structure and Behavior*, published by The Artificial Intelligence Laboratory, Massachusetts Institute of Technology, a system for troubleshooting digital circuits using "constraint suspension" to generate candidates for faults is described. In this system, a device is modeled as a network of interconnected constraints where each constraint models the behavior of one component. A malfunction is determined when the output predicted for a constraint does not match its actual measured output. A fault is isolated by determining a constraint whose retraction will leave the network in a consistent state. Probability of failure techniques are employed in which categories of failures are enumerated and layered according to most likely failures and paths of interaction. These paths of interaction are then selected for probing. Functional and structural decompositions of a structure may be also used, in an unspecified manner, as may be the concept of "adjacency" in which interaction of devices are described in terms of electrophysical or electromagnetic adjacency.

Since the Davis, et al. system uses probability of failure processes, it is not effective for low volume, high cost products. Moreover, the "constraint suspension" technique is not readily usable for high density components, since the numbers of constraints become increasingly large and difficult to model. Finally, while functional and structural decomposition is described, no decomposition techniques are shown for use in the real world systems.

Another artificial intelligence based troubleshooting system, jointly developed by IBM and Electonique Serge Dassault, is described in papers entitled *DEDALE: An Expert System For Troubleshooting Analogue Circuits* (Deves et al., 1987 International Test Conference, pages 586-594) and *Troubleshooting: When Modelling Is The Trouble*, (Dague et al., Engineering Problem Solving, pages 600-605). As described in these two publications, DEDALE includes a modelling approach based upon "order of magnitude reasoning", which includes definitions of "about equal", "negligible" and "same order or magnitude." Top down and horizontal decompositions are employed to decompose the circuit in an unspecified manner, while at the lowest level "order of magnitude" relationships are used. Each component may be described in terms of multiple correct models, and a conflict resolution technique is employed to determine the one correct model for a particular circuit.

The DEDALE system uses "order of magnitude operators" to represent significant or gross changes in the behavior of lowest level components. The order of magnitude operators are used to describe the behavior of a component at the boundary of two piece-wise linear regions where significant changes in behavior occur. Using the order of magnitude operators at the boundaries may result in errors because in most cases the boundary is only a few millivolts. Also, the technique of using order of magnitude operators cannot accurately model slight changes in behavior of components which may lead to a unit's failure.

Moreover, the "order of magnitude" modelling technique is not applicable to all low level components or to higher level functional blocks which are necessary for modelling a complete circuit at different abstraction levels. No techniques are described for accurately decomposing the unit, nor is a technique disclosed for searching the decomposed circuit to isolate a fault. No techniques are shown for intelligently beginning the search for a failure in a manner which efficiently leads to the failed components. Accordingly, while the DEDALE system may be helpful for very simple units, where in fact a troubleshooting system is not needed, it is not extendable to dense and complex units.

Finally, U.S. Pat. No. 4,709,366 to Scott et al. entitled *Computer Assisted Fault Isolation In Circuit Board Testing* discloses a computer driven troubleshooting system which causes a computer to generate a unique stimulus pattern tailored to a particular node which is being probed. Preliminary functional tests may be used to determine display clues as to where to probe, by storing a "clue list" corresponding to those circuits which have failed a functional test. For example, if the unit under test fails during a test of its random access memory (RAM), the clue display to the technician may recommend initial probing of particular component pins at the RAM portion of the circuit board. Unfortunately, the Scott et al. system requires the generation of multiple unique stimulus patterns. Moreover, while the fact that a portion of the circuit has failed a test is used to provide "clues" to a technician, there is no technique disclosed for beginning troubleshooting of circuits which have failed, where an area of failure has not already been identified.

In summary, the art appears to have recognized that artificial intelligence based approaches, coupled with component modelling and circuit decomposition, have the potential to provide a troubleshooting system which can effectively locate faults in low volume high cost units using minimal node probing. The art has yet to transform this recognition into a system which is effective for real world units.

SUMMARY OF THE INVENTION

It is therefore an object of the invention to provide an improved method and apparatus for locating faults in electronic units.

It is another object of the present invention to provide a computer-based method and apparatus for fault location in complex electronic units.

It is yet another object of the invention to provide a fault location system which does not require probability of failure data for troubleshooting.

It is still another object of the invention to provide an improved troubleshooting system which does not require generating large numbers of test patterns to locate a fault.

It is a further object of the invention to provide an improved troubleshooting system which employs artificial intelligence reasoning based techniques.

It is yet a further object of the invention to provide an improved fault location system which employs improved modelling techniques.

It is still a further object of the invention to provide an artificial intelligence based troubleshooting system which employs efficient search strategies for isolating a fault.

It is still another object of the invention to provide an artificial intelligence based troubleshooting system which provides improved methods for beginning initial troubleshooting of a known defective unit.

It is yet a further object of the invention to provide an artificial intelligence based troubleshooting system which requires a minimum number of measurements.

These and other objects are provided by a computer based artificial intelligence troubleshooting system for electronic units in which the unit under test is modeled in terms of "behavioral constraints". According to the invention, behavioral constraints include a technique for modelling circuit components in terms of "phase constraints", which are incremental changes in predetermined outputs thereof which result from changes in predetermined inputs thereto. In other words, increases or decreases in predetermined outputs are expressed as a function of increases or decreases in predetermined inputs. Phase constraints may be expressed as a function of current, voltage, frequency, or other parameters. An example of a phase constraint for a bipolar transistor operating in its linear region is "an increase in the base to emitter voltage causes an increase in the base current".

The phase constraints of the present invention may be expressed as a series of IF-THEN statements in the form of IF (input change 1, input change 2, ... input change N), THEN (output change 1, output change 2 ... output change N), where input change 1, input change 2, ... input change N represents changes in predetermined inputs, and output change 1, output change 2 ... output change N represent changes in predetermined outputs. Phase constraints may be expressed in terms of "in phase" or "out of phase" relationships among outputs and inputs, for example "(output 1 - output 2) in phase (input 2 - input 1)". Other ways of expressing phase constraints will be understood by those having skill in the art.

Behavioral constraints in addition to phase constraints may also be employed to characterize a unit to be tested. Thus, for example, gain constraints, which are expressed as arbitrary linear or nonlinear mathematical relationships between outputs and inputs, may also be employed. Gain constraints are a precise description of the behavior of components or functional blocks. They are described in terms of exact changes (including sign and magnitude) of electrical quantities. An example of a gain constraint for an amplifier is "the output will produce a voltage which is six times the input voltage". Gain constraints are quantitative in nature, and may be instantaneous or incremental. Instantaneous gain constraints may be used to predict an exact voltage on the output(s), when exact input voltage(s) are known. For example, "if input A=3V then output B=6V". The instantaneous gain model does not need sign changes for its description. Incremental gain constraints are used to predict exact change (including sign and magnitude) of the output(s), when the exact input voltage changes are known. For example, "if input A changes by 2V, output B changes by 6V".

The behavioral constraint model description of the present invention may also be completed by including "compliances" to indicate those conditions which may invalidate the model partially, or to indicate the model's tolerance of small voltage or current changes. Out-of-compliance conditions, which normally arise due to saturation of some components, may partially invalidate the gain and phase models. Accordingly, the minimum or maximum possible values of an output or input, regardless of the values of any other outputs or inputs, may be specified. For example, "$-12V \leq OUT1 \leq 12V$". Moreover, in many cases, when voltages or currents change very little, the incremental models are liable to introduce error because a quantity which did not change outside the limits of tolerance may be considered as having changed. This can produce drastically different results, and the system may even misdiagnose. According to the invention, tolerances on certain quantities, such as currents, and voltages, and on component parameters, such as a component's "state" help avoid such misinterpretation of data.

According to the invention, a unit under test may be modeled in terms of behavioral constraints at all functional abstraction or decomposition levels thereof. In particular, it has been found according to the invention that the concept of behavioral constraints is applicable to almost every commonly found electronic component (for example transistors, resistors, diodes, etc.). Intermediate level and higher level components such as operational amplifiers or phase locked loops may also be accurately modeled in terms of behavioral constraints. These techniques are also applicable to both DC and AC conditions.

Thus, behavioral constraint modelling provides a universal modelling scheme for modelling hierarchical decomposition levels of a unit under test, which models may be employed by an artificial intelligence based system for isolating faults. Accordingly to the invention, a Constraint Modelling Language (CML) is provided to describe arbitrary qualitative, quantitative and boolean transfer functions. This language helps extends the qualitative and quantitative model ideas to all components, as well as to higher-level functional blocks.

The models of components or functional blocks are pure functional models and are independent of the way they are used in a particular circuit. An advantage of using such abstract models is that it is not necessary to describe the behavior of several similar blocks or components. In fact, even though there may be hundreds of different kind of transistors, there is only one abstract model of a transistor. In order to model subtle variations between similar components or functional blocks of the same kind, certain parameters or tolerances may be provided as editable quantities for each particular block.

In addition to providing a universal modelling scheme, it is also been found that modelling of various functional abstractional levels in terms of behavioral constraints provides a highly accurate indication of subtle changes in a circuit. In other words, measurements of an component may deviate from their expected values because the component is defective or because the inputs to the component are incorrect due to a fault outside the component. Behavioral constraint modelling according to the invention provides an accurate indication as to whether subtle differences in outputs are as a result of a defect or as a result of a changed input which is applied to a nondefective component. In comparison with known "order of magnitude" modelling techniques, improved fault isolation is provided.

According to another aspect of the present invention, improved search strategies are employed for rapidly isolating a defective component. The search strategy employs the concepts of "top down", "bottom up" and "horizontal" searching. In particular, the search strategy begins with a top down strategy for the entire unit under test. If a test fails, the search for a fault moves down one level and tests the next lower level module having an output corresponding to the output of the higher level module. If tests of the next lower level module indicate that this component is not defective, the search proceeds to an adjacent module at the same level, having outputs which are connected to the inputs of the module which passed.

Also according to the invention, a strategy is provided for handling cases when the behavior of a module is unknown. In this case, the search initially proceeds to the adjacent modules of the unknown module, and after all adjacent modules have been tested, the search returns to test the lower level modules of the unknown module. A different strategy is provided when the lower level modules of a module are components (LRUs). In this case, a prioritized list of components based upon knowledge of failure modes of components may be used to search the lower level modules. The search strategy of the present invention allows fault location to take place with a minimum number of measurements, and may be employed for highly complex circuits.

According to yet another aspect of the present invention, testing of a unit is begun by performing functional tests on the unit. In contrast with prior art techniques, which employed probabilistic models to determine most likely to fail components or which randomly began testing, the present invention has recognized that a valuable source of testing information exists in the functional test plan which is typically provided by a unit designer. The functional test plan provides a complete set of electrical tests which must be satisfied for a unit to be considered operational.

According to the invention, the functional test plan is stored in a computer, and means are provided for associating a functional test with one or more modules at any functional abstraction level. Then, to initiate troubleshooting, the functional tests are executed in the order specified by the unit designer. When a functional test fails, troubleshooting begins at the module and functional abstraction level associated with the failed functional test, using the search strategy described above. For example, a particular functional test may be designed to apply particular stimuli and measure particular outputs in response thereto. When storing this functional test in the troubleshooting system of the present invention, an identification of the module designed to be tested by the particular test is also specified. Thus, it may be indicated that test 4.1.2 is designed to test the Channel 1 Amplifier. If this test fails, troubleshooting begins with the Channel 1 Amplifier, at its functional abstraction level.

Use of the functional test plan to begin troubleshooting according to the present invention differs markedly from prior art techniques which used the fact that "RAM test failed" to begin testing at the RAM. Typically, when a unit has been identified as having failed, it is not known that a particular component or area of the unit has failed; it is only known that the unit as a whole has failed. The present invention recognizes that the existing functional test plan provides an efficient method for initiating the troubleshooting process.

The present invention has been described in terms of a unique modelling technique, a unique search strategy, and unique functional test initiation. It will be understood by those having skill in the art that each of these techniques may be employed independently for improved computer-based troubleshooting of electronic units. Thus for example, the models of the present invention may be employed with other computer-based search strategies. Indeed, behavioral constraint modelling may be employed to efficiently characterize a circuit at various levels of functional abstractions in any system that requires such a characterization; for example, for computer-based circuit design systems. Similarly, the search strategies of the present invention may be employed with modelling techniques other than the present invention. Finally, the functional test plan may be employed for initiating troubleshooting in systems which use other search strategies or modelling techniques. It will also be understood by those having skill in the art that the combination of constraint modelling techniques, efficient search strategy and functional test plan initiation of troubleshooting provides a system which is uniquely able to isolate a defective component in a complex densely packed electronic unit.

BRIEF DESCRIPTION OF THE DRAWINGS

FIG. 8 illustrates an overall flowchart for evaluating the behavior of a functional abstraction level block according to the present invention.

FIGS. 9a-9d illustrate user screens for obtaining information concerning a test plan according to the present invention.

FIGS. 11a-11d illustrate screen layouts for troubleshooting according to the present invention.

DETAILED DESCRIPTION OF THE INVENTION

The present invention now will be described more fully hereinafter with reference to the accompanying drawings, in which a preferred embodiment of the invention is shown. This invention may, however, be embodied in many different forms and should not be construed as limited to the embodiment set forth herein; rather, applicants provide this embodiment so that this disclosure will be thorough and complete, and will fully convey the scope of the invention to those skilled in the art. Like numbers refer to like components throughout.

Figure 1:
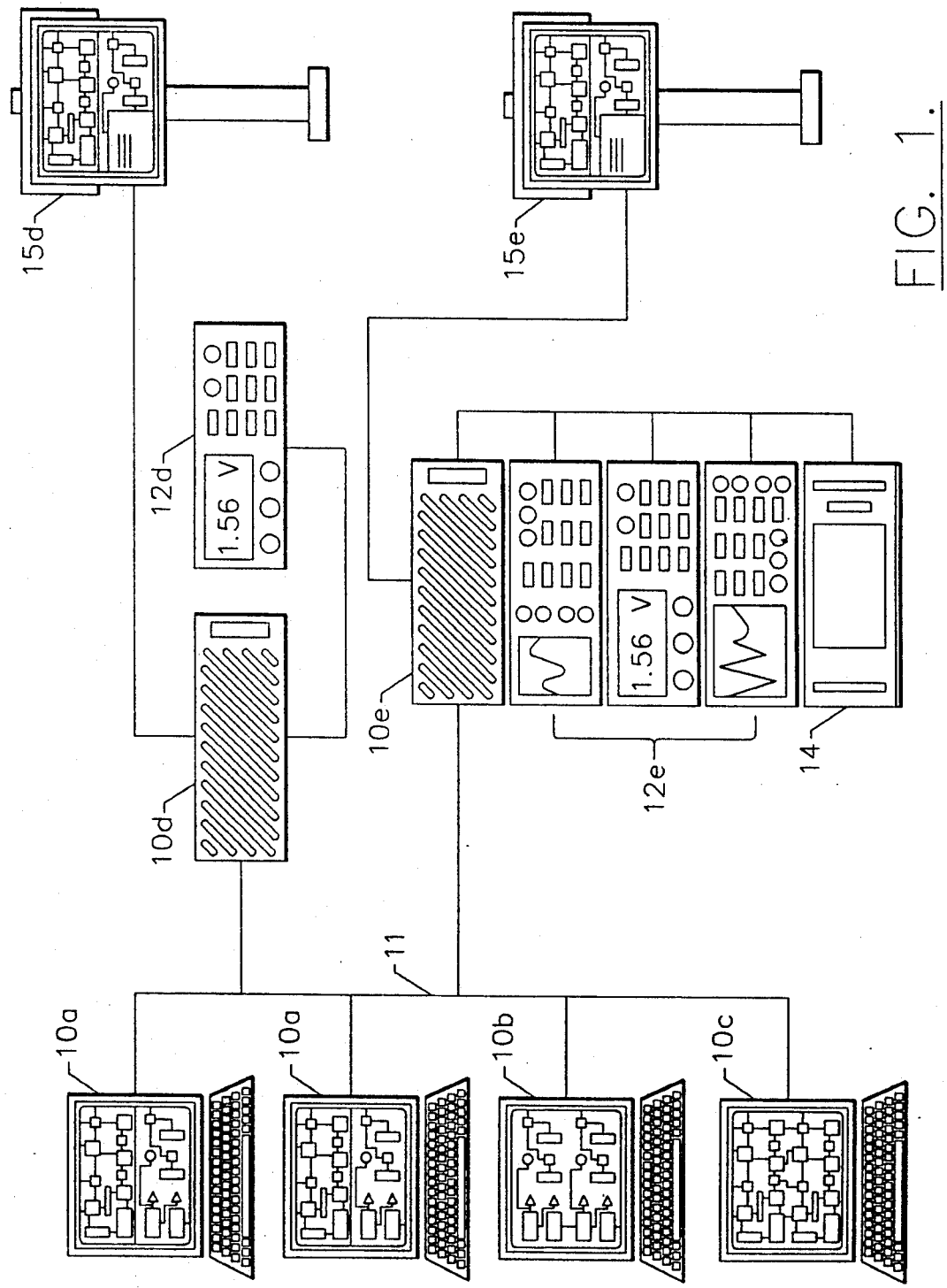
FIG. 1 illustrates a hardware architecture for the present invention.

Referring now to FIG. 1, a hardware architecture for the present invention will be described. It will be understood by those having skill in the art that other architectures may be employed. Referring to FIG. 1, a plurality of workstations 10a-10e, for example workstations manufactured by Sun Microsystems, Inc., Mountain View, Calif., may be linked together using a local area network 11.

Workstations 10a-10c may be employed to configure the system for troubleshooting a particular electronic unit. In particular, schematic capture station 10b interfaces with conventional Computer Aided Engineering (CAE) systems, for accepting a computerized representation of a unit's schematic diagram using Electronics Data Interchange Format (EDIF), PCAD Data Interchange Format (PDIF) or any other well known schematic representation technique. Physical layout station 10c interfaces with conventional Computer Aided Design (CAD) systems, for accepting a computerized representation of a unit's physical layout, using Hewlett Packard Graphic Language or other well known physical layout representation techniques. Alternatively, stand alone schematic and physical layout generation tools may be provided in workstations 10b and 10c. Configuration workstations 10a are used during the configuration phase to map the physical layout and schematic data to one another as described more fully below. Functional test data may also be entered at configuration station 10a, as described more fully below.

Configuration data generated by configuration stations 10a may be supplied to troubleshooting workstations 10d and 10e via local area network 11. Troubleshooting stations 10d, 10e are employed by a troubleshooting technician to isolate faults in defective units. Two types of troubleshooting stations are shown. Workstation 10d is directly connected to a measuring instrument 12d using an IEEE-488 or other well known bus. Workstation 10d is also connected to a display 15d, which displays the physical layout, circuit schematic and troubleshooting instructions as described more fully below. Workstation 10e may be interfaced to instruments 12e via an instrument controller or tester 14 of well known design, or may be directly interfaced to instruments 12e. A display 15e is also shown.

It will be understood by those having skill in the art that instruments 12 or instrument controller or tester 14 need not be directly connected to a workstation 10. Rather, a troubleshooting technician may be directed to perform measurements on a unit under test by workstation 10d and enter the resulting measurements directly into workstation 10d. It will also be understood that the functions of workstations 10a-10e may be integrated into a single workstation.

Figure 2:
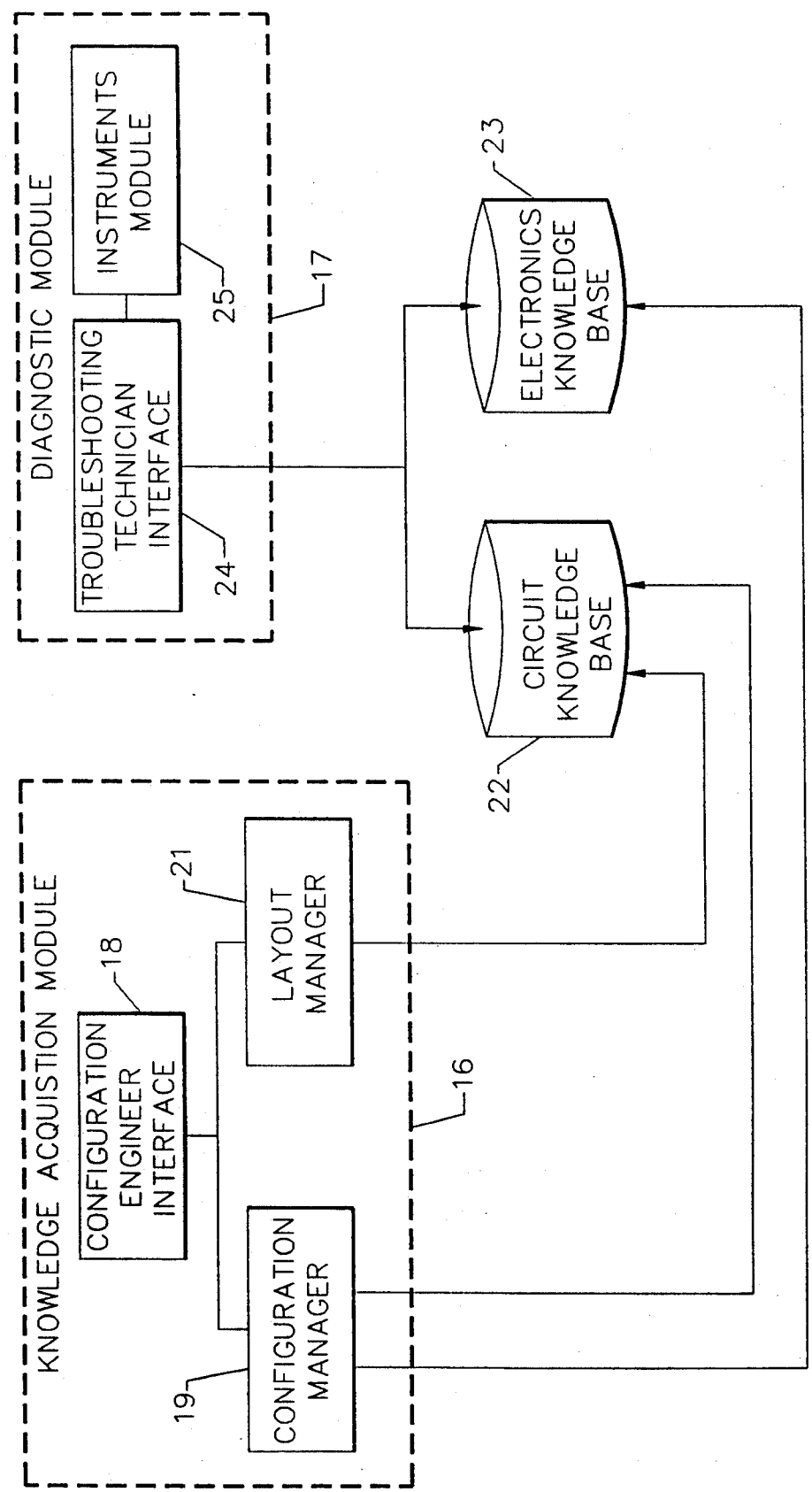
FIG. 2 illustrates a high level block diagram of the troubleshooting system of the present invention.

Referring now to FIG. 2 a high level block diagram of the troubleshooting system of the present invention is disclosed. The troubleshooting system of the present invention is an artificial intelligence based expert system including a Knowledge Acquisition Module (KAM) 16, also referred to as a "configurator", and a Diagnostic Module (DM) 17, also referred to as a "troubleshooter". It will be understood that KAM 16 may reside in workstations 10a-10c while DM 17 may reside in workstations 10d-10e (FIG. 1). Alternatively both KAM 16 and DM 17 may reside in a single workstation.

KAM 16 provides the software tools for entering circuit information into the system. These tools may include a layout manager 21 for interfacing with CAD and CAE its physical layout. Also included is a configuration manager 19 which allows a configuration engineer to perform a hierarchical decomposition of the circuit for use by DM 17. A user friendly configuration engineer interface 18 may also be provided. A detailed block diagram of KAM 16 is described in connection with FIG. 3.

DM 17 employs a combination of model-based representations and heuristic search techniques. The DM 17 is used for evaluating an electronic unit's behavior based on predetermined search strategies. An instruments module 25 may be provided to interface with individual instruments 12d (FIG. 1) or an instrument controller 14 (FIG. 1). A user friendly troubleshooting technician interface 24 may also be provided. The DM 17 is described more fully in connection with FIG. 4.

Both KAM 16 and DM 17 operate upon two databases, known as a circuit knowledge base 22 and electronics knowledge base 23. Circuit knowledge base 22 contains actual circuit data concerning the electronic unit to be tested, including its physical layout, circuit diagram, hierarchical composition and test plan. The electronics knowledge base 23 contains generic electronics data for physical components such as transistors, resistors or operational amplifiers, and higher level functional modules such as filters, summers, integrators and multiplexers, expressed in terms of at least phase, gain and compliance according to the present invention.

Figure 3:
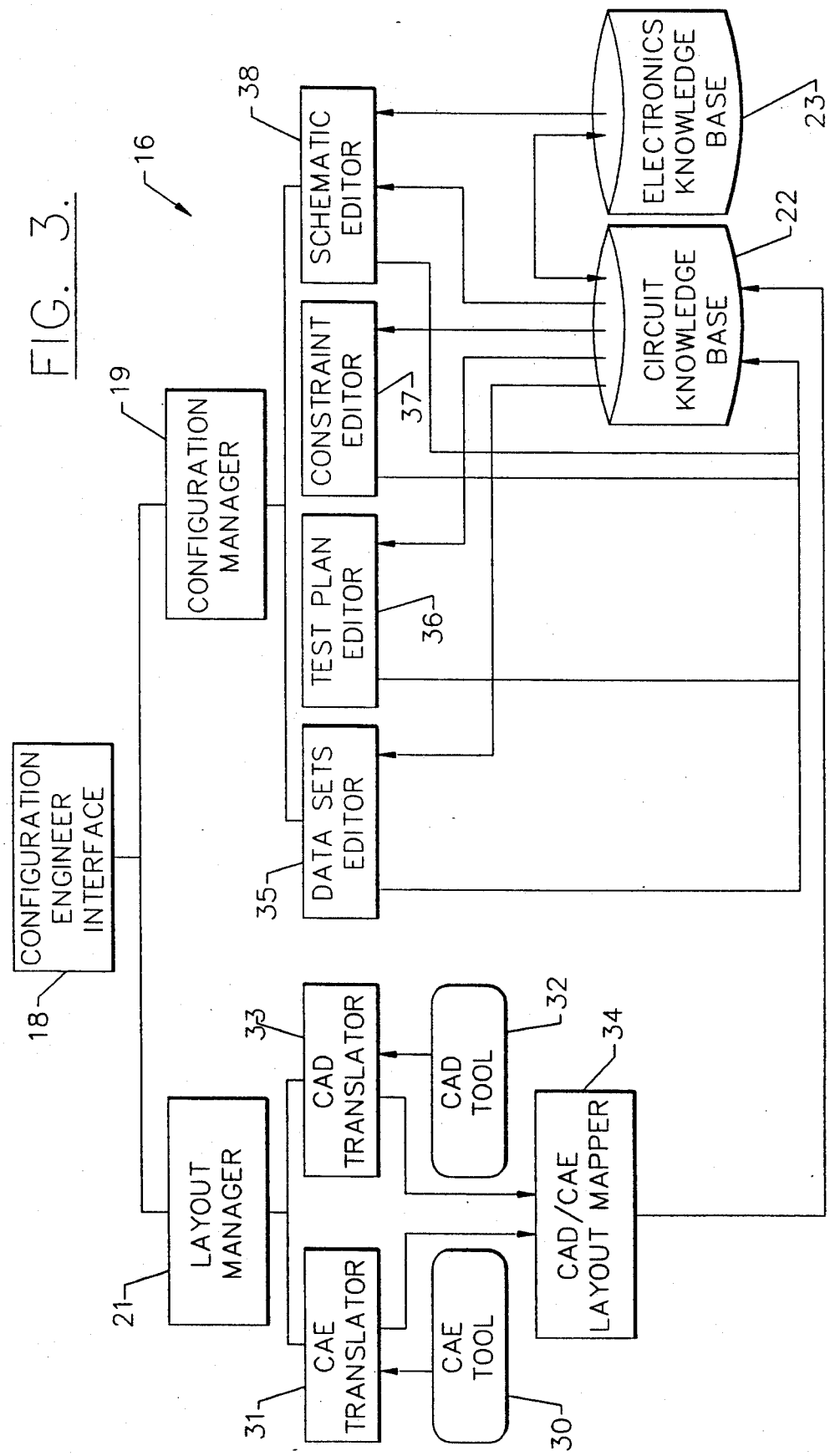
FIG. 3 illustrates a detailed block diagram of the knowledge acquisition unit of FIG. 2.

Referring now to FIG. 3 a more detailed block diagram of KAM 16 is illustrated. KAM 16 comprises three major subunits referred to as a configuration engineer interface 18, layout manager 21 and configuration manager 19. Configuration engineer interface 18 provides a user friendly interface for use by the configuration engineer. The layout manager 21 processes external information about the circuit under test by taking output from CAE or CAD tools, translating them into a format for use by the troubleshooting system of the present invention, if necessary, and mapping their correspondences. The configuration manager 19 comprises four editors which allow the configuration engineer to add more information about the circuit being configured. The components of layout manager 21 and configuration manager 19 will now be described.

Layout manager 21 obtains CAE files in well known PDIF or EDIF format or other well known formats from CAE tool 30. The design of the CAE tools and the formatting of data thereby is well known to those having skill in art and will be not described further. A CAE translator 31 may be employed to extract data from the circuit schematic diagrams which are needed for troubleshooting purposes, for example data concerning the netlist and the graphic locations of all components and their interconnections. The netlist is used to provide connectivity information of all components. The graphic information is used to properly display the components and interconnection nodes. If CAE data on the unit under test is not available, a schematic editor, 38 (described below) will allow creation of a circuit schematic.

Circuit layout information is also obtainable from a CAD 32 tool using HP-GL or other well known formatting techniques. A CAD translator 33 extracts the physical layout data which is necessary for troubleshooting purposes for example, graphic placement of each component and node on the schematic. The translated CAE and CAD data is then mapped to one another using the CAD/CAE Layouts Mapper 34. This mapping of nodes on the circuit schematic to corresponding probe points on physical layout is well known to those having skill in the art and will not be described further.

The mapped CAD and CAE layouts will be employed to provide the configuration engineer and the troubleshooting technician with two views of the unit under test during the configuration and troubleshooting processes; i.e. circuit schematic and physical layout views. The mapped CAD and CAE databases are placed in the circuit knowledge base 22 for further use in the configuration mode. It will be understood by those having skill in the art that a physical layout is not always necessary for purposes of configuration or troubleshooting. The physical layout is, however, useful to give a good visual indication about where to probe and component locations, during troubleshooting. Accordingly, if a physical layout database is not available, the physical layout will not be displayed during configuration and troubleshooting. All that is necessary for configuration and troubleshooting is a schematic database so that a hierarchical decomposition may be employed.

Still referring to FIG. 3, configuration manager 19 includes a data sets editor 35, test plan editor 36, constraint editor 37 and schematic editor 38. These editors will now be described. The schematic editor 31 is employed to define the schematic structure of a circuit. It allows the circuit configurator to group components into modules, sub-modules and super-modules according to a hierarchical decomposition. When moving from one level of abstraction to another, the schematic editor may indicate both what submodules belong to what super-modules and what modules are identifiable on all levels so that both connectivity and granularity of the circuit are preserved. If the lowest level of the circuit schematic is not available from CAE tools, it may also be created using the schematic editor.

Constraint editor 37 is employed to change the constraint models from those default models already present. According to the invention, all modules at all functional abstraction levels are modeled in terms of a constraint modelling which employs phase, gain and compliance limits. Default models for all functional abstraction level modules are provided. However, the constraint editor 37 allows the default models to be modified based on the particular circuit components being tested. Also, new functional blocks which are not provided as part of the library models may be added.

The test plan editor 36 provides guidance for the troubleshooting technician and the troubleshooting instruments through the diagnostic process. This editor allows the configuration engineer to specify the functional tests to be run and those inputs and outputs which indicate whether the test has passed. These tests are organized within the test plan editor so that the tests are run in the correct order. The test plan editor also provides a mechanism for entering data about the functional abstraction module which is tested by the particular test. According to the invention, this data is employed by the troubleshooting system to begin functional testing at the module and functional abstraction level which failed. The mechanism for providing additional test plan data will be described in detail below.

The data sets editor 35 may be considered a subdivision of the test plan editor 36. The data sets editor lets the configurator specify the normal behavior of the circuit under test in terms of expected parameters for a functionally working circuit.

Figure 4:
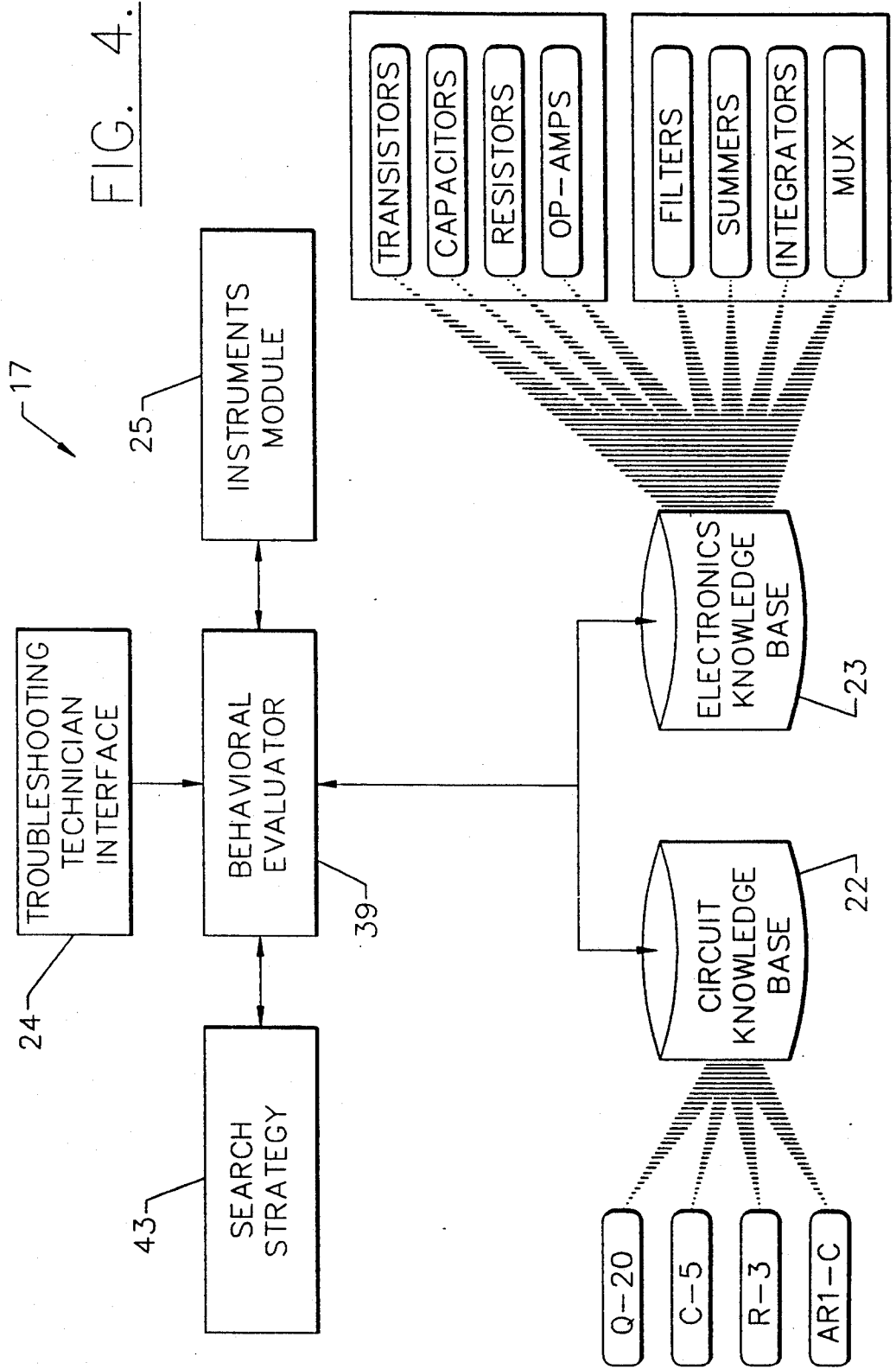
FIG. 4 illustrates a high level block diagram of the diagnostic unit of FIG. 2.

Referring now to FIG. 4, a high level block diagram of DM 17 will be described. DM 17 operates upon the aforementioned circuit knowledge base 22 which includes actual circuit data for the unit under test, and the electronics knowledge base 23 which includes general electrical knowledge of physical components such as transistors and capacitors, and functional modules such as filters and summers, expressed in terms of behavioral constraints. The DM 17 directs a troubleshooting technician, or an instrument controller or a combination thereof, to troubleshoot a circuit. Technician interface 24 provides a user friendly interface for directing the technician. Instruments unit 25 provides an interface for controlling instruments or a controller.

The DM 17 includes a behavioral evaluator 39 and a search strategy module 43. The behavioral evaluator operates upon the circuit knowledge base 22 and electronics knowledge base 23 and employs the search strategy 43 to localize a fault from the highest abstraction level to intermediate abstraction levels and finally to a component (LRU) level. The behavioral evaluator 39 also controls the instruments module 25 and technician interface to direct probing or other measurements at physical locations on the module. The search strategies 43 employed by the diagnostic module to fully test a circuit will be described below.

Configuration Process

Figure 5:
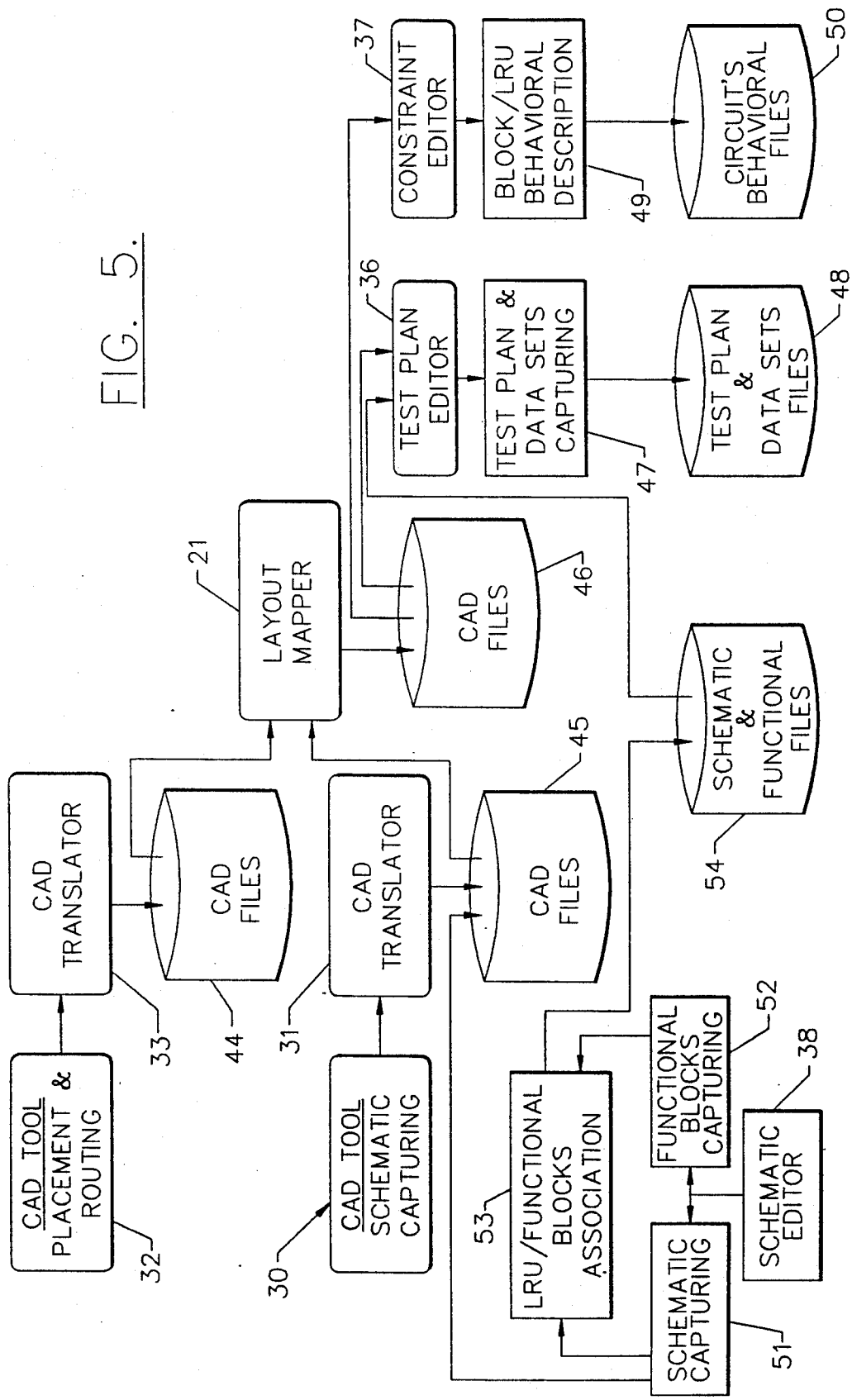
FIG. 5 illustrates a configuration process according to the present invention.
Figure 6A:
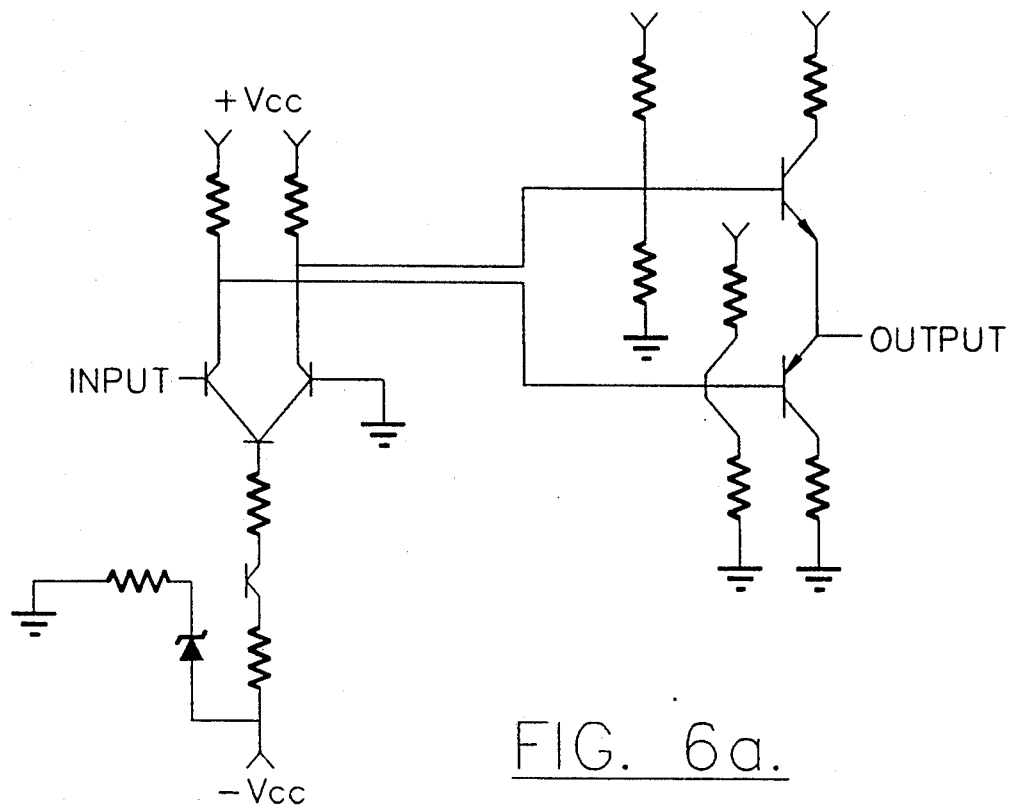
FIGS. 6a-6d illustrates an example of a hierarchical decomposition according to the present invention.
Figure 6B:
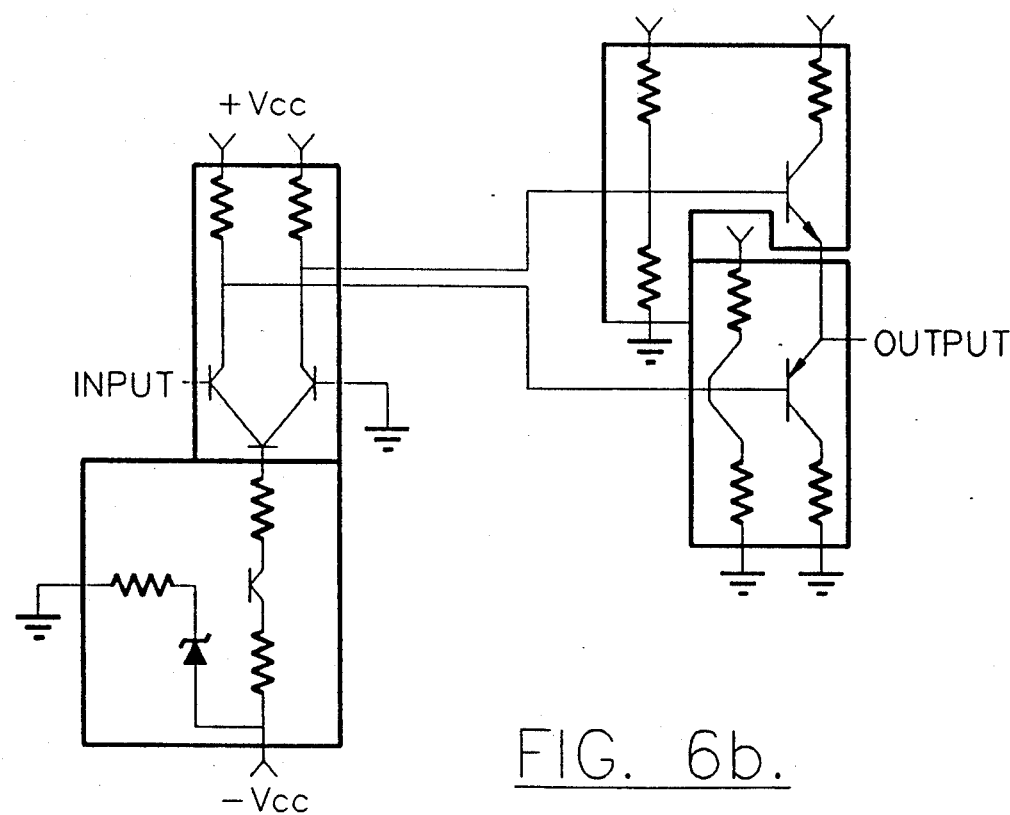
Figure 6C:
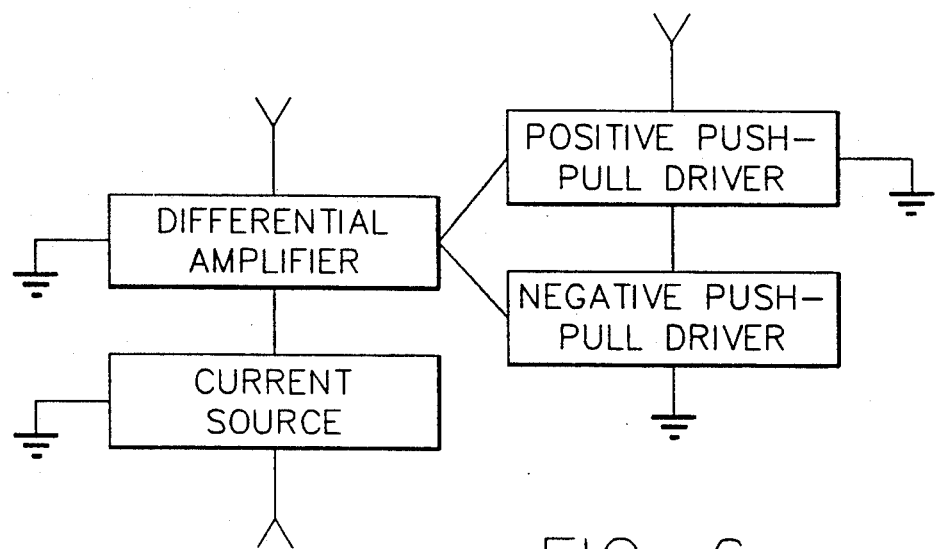
Figure 6D:
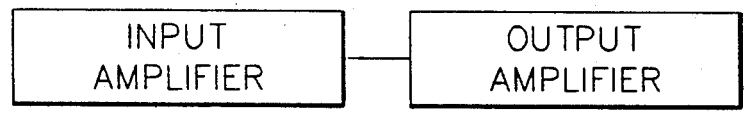

Referring now to FIG. 5 the use of the knowledge acquisition module 16 to configure or characterize a unit to be tested will now be described. Configuration may begin by translating existing placement and routing (CAD) data 32 and schematic (CAE) data 33 into a format useable by the troubleshooting system of the present invention using CAD translator 33 and CAE translator 31. The translated CAD data is placed in a CAD file 44 while a CAE data is placed in a CAE file 45. If CAD data is not available then placement and routing information will not be placed in a CAD file and this information will not be displayed during configuration and troubleshooting. Schematic (CAE) data is required in order to build a hierarchical decomposition of the circuit and to troubleshoot the circuit. If CAE data is not available from an existing CAE tool it is created using schematic editor 38. Schematic editor 38 provides tools for creating a schematic (Block 51), describing the functional blocks which build the hierarchical decomposition of the circuit (Block 52) and associating the schematic and functional blocks (Block 53).

If existing CAD and CAE files are present they are mapped to one another using a layout mapper 21 and stored in layout files 46. The layout mapper 21 merges CAD files 44 and CAE files 45 and checks these files for consistency. Then, all nodes in the physical layout and the schematic diagram are mapped together and checked for consistency.

Schematic editor 38 is used to construct the functional abstraction levels of the circuit. The schematic editor allows the configuration engineer to combine the components of schematic diagrams (created on-line or from the CAE tool) into modules or groups of related components and to continue a hierarchical composition of these functional blocks until the highest functional blocks corresponding to the entire unit under test is created. The schematic editor may work in levels, with the bottom level consisting of LRU components and nodes. The schematic editor allows the combination of components and nodes at the bottom level to form modules at a next level. The units at that level may be grouped into super-modules, at a next higher level an so on until the entire unit under test is subsumed.

Referring to FIG. 6, a simple example of hierarchical decomposition is illustrated. FIG. 6a illustrates an example of a lowest level schematic diagram either generated via the schematic editor 38 or captured from CAE tool 30. FIG. 6b illustrates a next higher functional abstraction level, in which the circuit diagram has been partitioned into four distinct areas each of which includes several related components. Each of these areas may be represented by a module as shown in FIG. 6c. These modules may further be combined into super-modules as shown well known to those having skill in the art of circuit design and will not be described further herein.

Referring again to FIG. 5, after the circuit is configured, the test plan may be entered using test plan editor 36. It will be understood that the test plan may be entered by entering a test plan program which is used to run an automated tester, and translating this program for use by the present invention. According to the present invention, additional information about a test plan is entered, to associate a particular test with a particular functional abstraction level block which was previously captured in the schematic and functional files 54. Finally, the constraint editor 37 may be employed to modify the behavioral constraints from those default constraints provided in the library. These constraints are edited in terms of constraint modelling language (described below) to create a circuit behavioral file 50.

Behavioral Constraints

According to the invention, the normal operating behavior of every component in a circuit is defined by behavioral constraints. Behavioral constraints are the qualitative and quantitative relationships between an component's input and output terminals expressed in terms of phase, gain and compliances. A simple phase relationship might be: if the voltage on the component's input terminal increases then the voltage on the component's output terminal increases. A simple gain relationship might be: the voltage on the component's output terminal is six times the voltage on the component's input terminal. A simple compliance might be: the voltage on an component's output terminal is always between $-6V$ and $+6V$. Behavioral constraints for electronic components such as resistors and transistors are defined by electronic theory. Behavioral constraints for the higher level modules are defined by the interrelationships of its components. Modelling is performed in terms of "phase", "gain" and "compliance" constraints for all functional modules.

Phase relationships may be very simple, for example IF (input 1 goes up), THEN (output 1 goes up). They may also be very complicated, for example IF (input 1 minus input 2 goes up more than input 3 goes down), THEN (output 1 goes down). Phase relationships become complicated when an module's inputs are interacting.

Behavioral constraints are employed to evaluate a modules behavior during diagnosis of a fault condition in the module. A module may have abnormal voltages at its inputs and outputs but still be within its behavioral constraints. In this case, the module is not suspected as faulty. Behavioral constraints allow for a component to behave in a radically different way from its normal behavior in a circuit and still not be suspected as faulty.

Behavioral constraints will now be described in detail. These constraints may be represented according to the invention in terms of increasing, decreasing, changing, not changing, positive, negative, zero and nonzero quantities at the input and output terminals of any functional abstraction level of a circuit. According to the invention, this qualitative description is modelled by using general purpose Constraint Modelling Language (CML) which represents each of the above qualitative terms.

CML may be used to represent the behavior of both active and passive components. In the case of active components, such as transistors the three distinct regions of operation are linear, off and saturated. The linear region is easily represented using some of the above mentioned qualitative terms such as increasing, decreasing, changing positive and negative. The off and saturated regions may be similarly represented. Passive components like resistors may be modelled in a similar way. For example all resistors may be modelled by the following simple constraint: an increasing current causes an increasing voltage drop.

The behavior of higher level abstraction modules such as amplifiers, switches etc. may also be described in exactly the same way. Thus, the behavioral constraints employ the same language at all levels of functional abstraction. Their interpretation during diagnosis does not depend upon the functional level. Accordingly, the invention provides a general framework for representing these constraints for use during diagnosis. CML may also be employed to describe quantitative constraints such as gain relationships. These relationships are useful for detecting fine errors such as small changes in resistance values, small changes in the gain of an amplifier, etc.

A detailed description of the Constraint Modelling Language (CML) of the present invention will now be provided. For a given functional block, the behavioral constraints consist of the following categories of information which are specified using CML: user variable definitions, compliances, phase relations and gain relations. In the CML grammar, there are various kinds of operators: reference, arithmetic, relational, logical, qualitative, phase and state. The reference operators may refer to actual voltage, normal voltage, frequency or difference of actual and normal voltage (delta) or a logic value of a terminal. The arithmetic operators combine numbers and produce numbers. Arithmetic operators may be provided for addition, subtraction, multiplication and division, absolute value, exponentials, and logarithms. The relational operators compare numbers and produce logical TRUE or FALSE. Relational operators may be provided for greater than, less than, equal to, not equal to, greater than or equal to, and less than or equal to. The logical values could be HIGH, LOW, TRISTATE, UNDEFINED or DON'T CARE. The logical operators combine logical values and produce a logical value. The logical operators are NOT, AND, OR and EXCLUSIVE-OR.

The qualitative operators are UP, DOWN and SAME. The qualitative operators are used to describe changes in quantities such as voltage, current and frequency. The phase operators are IN-PHASE and OUT-OF-PHASE. The are used to describe phase relationships between input and output terminals. The qualitative operators are often used in tandem to relate input and output terminals, for example IF: UP (IN1-IN2) THEN: DOWN OUT1. The phase operators are also used to relate inputs and outputs. If an increase in an input causes an increase in an output, they are IN-PHASE. Similarly, if an increase in an input causes a decrease in an output, they are said to be OUT-OF-PHASE. The STATE operator is used to refer to the current state of an LRU component. Some possible states for LRU components include linear, saturated, and off.

Constructing Behavioral Constraints

Examples of constructing phase, gain and compliance constraints will now be given.

In order to construct phase constraints for a particular unit the following steps may be undertaken:
1. Identify the unit's input and output ports.
2. Identify possible deviation in input ports, voltages using CML terms.
3. Evaluate each combination of CML terms for the input ports and determine,
    a. Resultant current flow to the output ports.
    b. Voltage on output ports from the resultant current flow.
    c. A phase constraint.

Figure 7:
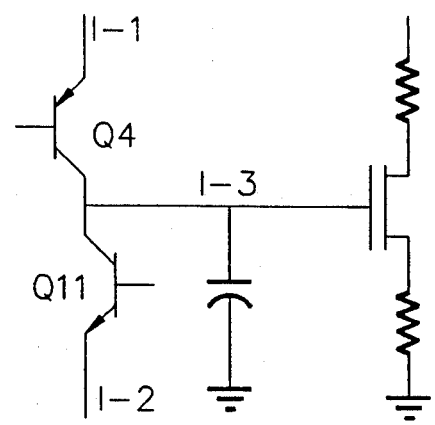
FIG. 7 illustrates a circuit diagram of a signal and shunt switch.

In order to illustrate application of these steps to a particular component, the behavioral constraints for a signal-and-shunt switch will now be derived. A schematic diagram of part of a signal and shunt switch is illustrated in FIG. 7. As is well known to those having skill in the art a signal and shunt switch functions to pass the signal to the output in the "signal" mode and to shunt it to ground in the "shunt" mode. The procedure is as follows:
1. Input ports: I-1, I-2 Output ports: I-3
2. I-1 and I-2's voltages can increase or decrease.
3.1 Increase I-1's voltage and Increase I-2's voltage
   a. Increase of voltage on I-1 causes Q-4 to be more on and to increase the current to I-3.
   Increase of voltage on I-2 causes Q-11 to be more off and to decrease current taken from I-3.
   Therefore, current on I-3 will increase.
   b. Increased current flow on I-3 causes increased voltage on I-3.
   c. IF (AND (I-1 UP) (I-2UP)) THEN (I-3 UP)
3.2 Decrease I-1's voltage and Decrease I-2's voltage
   a. Decrease of voltage on I-1 causes Q-4 to be more off and to decrease the current to I-3.
   Decrease of voltage on I-2 causes Q-11 to be more on and to increase current taken from I-3.
   Therefore, current on I-3 will decrease.
   b. Decreased current flow on I-3 causes decreased voltage on I-3.
   c. IF (AND (I-1 DOWN) (I-2 DOWN)) THEN (I-3 DOWN)
3.3 Increase I-1's voltage and Decrease I-2's voltage
   a. Increase of voltage on I-1 causes Q-4 to be more on and to increase the current to I-3.
   Decrease of voltage on I-2 causes Q-11 to be more on and to increase current taken from I-3.
   b. Current on I-3 depends on whether Q-4 increases current more than Q-11 takes away.
   c. IF (>(I-1 CURRENT-DOWN) (I-2 UP)) THEN (I-3 DOWN)
   IF (<(I-1 CURRENT-DOWN) (I-2 UP)) THEN (I-3 UP)
3.4 Decrease I-1's voltage and Increase I-2's voltage
   a. Decrease of voltage on I-1 causes Q-4 to be more off and to decrease the current to I-3.
   b. Current on I-3 depends on whether Q-4 decreases current more than Q-11 stops taking away.
   c. IF (>(I-1 DOWN) (I-2 UP)) THEN (I-3 DOWN)
   IF (<(I-1 DOWN) (I-2 UP)) THEN (I-3 UP)

The gain constraints are more straightforward to construct. They use reference operators in conjunction with arithmetic operators and specify some relationship between the input and output terminals of a module. For example, for an amplifier with input terminal IN and output terminal OUT, the instantaneous gain constraint could be, OUT=3 * IN and the incremental gain constraint could be, delta OUT=3 * delta IN.

The compliance constraints specify those conditions under which the gain and phase relationships are not applicable. They use the state and the relational operators of the CML for their description. For example, the input compliance on the amplifier of the above example could be, IN <−0.6 OR IN> 0.6 (i.e., the gain and phase constraints will not be applicable when the IN terminal is qreater than 0.6 volts or less than −0.6 volts). Similarly, the output compliance on the amplifier of the above example could be, state (AR14-A)=SAT (i.e., the gain and phase constraints will not be applicable when the state of the component AR14-A is saturated).

It will be understood by those having skill in the art that almost all commonly available components and modules may be readily modeled in CML, using voltages or currents or using extensions of CML in the frequency or light domain.

Evaluating Behavioral Constraints

During the troubleshooting phase, the diagnostic unit operates upon the circuit knowledge base 22 which includes all of the behavioral constraint models in order to determine whether a module is faulty or working properly. The search strategy for deciding which module to evaluate will be described below. The method of evaluating each module which has been chosen by the search strategy will now be described.

FIG. 8 illustrates the overall flowchart for evaluating the behavioral constraints of a functional block. As will be seen, the phase constraints are evaluated before the gain constraints. Referring to FIG. 8, a module is first picked up for evaluation (Block 61) and the phase constraints associated with the module are evaluated (Block If the phase is violated then a check is made to see if phase is inverted (Block 63). If the phase is inverted, then a check is made to see if the fault is because of faulty control or power inputs to the module (Block 64). If the controls and power are not faulty then the module is declared faulty (Block 65) and the search strategy picks the next module or component to be evaluated. If the controls or power are bad, then the modules which supply bad controls or power are picked and evaluated (Block 66).

Returning to Block 63, if the phase is violated but it is not inverted, then a check is made to see if it could be because of violation of compliance (Block 67). The outputs are checked first to make sure that they are within compliances (Block 67). If the outputs are within compliances, then a check is made to see if the fault is because of faulty control or power inputs to the module (Block 64). However, if the output compliances are not met, then a check is made to see if the output compliances are violated because of violation of compliances on the inputs (Block 68). If the input compliances turn out to be good, then the fault could be because of faulty control or power inputs to the module and the processing of Block 64 is followed. However, if the input compliances are bad, then the module behavior is determined as unknown (Block 69).

Returning to Block 62, if the phase constraints are not violated, then the gain constraints are evaluated (Block 70). If the gain constraints also pass, then the module is declared okay (Block 71) and the next module is picked for evaluation by the search strategy. If the gain constraints fail, then different actions are taken depending upon the gain constraint type. If the gain constraint is an instantaneous gain constraint (Block 72), then a check is made to see if the module is faulty due to violation of compliances. This is done by following the flow chart description for entry point A. However, if the gain constraint is an incremental gain constraint, then a check is made to see if the actual output is more than the expected output (Block 73). If it is so, then a check is made to see if the fault is because of faulty control or power inputs to the module. This is done by following the flowchart description for entry point B. If the actual output is less than the expected output then a check is made to see if the sign of the output voltage is as expected (Block 74). If the sign is as expected, then the fault could be because of violation of compliances. This is checked by following the flowchart description for entry point A. However, if the sign is violated, then the fault could be due to faulty control or power inputs to the module. This is checked by following the flowchart description for entry point B.

The operations described above in connection with FIG. 8 will now be described in terms of a simple gain block. As is well known to those having skill in the art a gain block provides a prescribed amount of gain on the input voltage. For purposes of this example, the behavioral constraints for the gain block are assumed to be:

Input Compliances:
  IN1 > −0.6 OR IN1 > 0.6
Output Compliances:
  state (AR14-A)=saturated
Phase Relations:
  OUT1 in-phase IN1
Gain Relations:
  delta OUT1=1 * delta IN1

For purposes of this example, assume that the normal voltages of the gain block are IN1=0.2V, OUT1=0.2V. Two cases will now be described: For case 1, suppose the values of the actual voltages of gain block are IN1=1.1V, OUT1=−5.1V. Therefore, IN1 has changed from 0.2 to 1.1V, i.e. a change of 0.9V, and OUT1 changed from 0.2 to −5.1V, i.e. a change of −5.3V. Therefore, a change of 0.9V in IN1 has caused a change of −5.3V in OUT1 which is in the opposite direction. The phase behavior of the gain block was specified as OUT1 in-phase IN1. The phase relation is found to be inverted and a check for bad power and control is invoked. Assuming control and power is good, the gain block is deemed to be faulty.

For case 2, suppose the values of the actual voltages of the gain block are: IN1=1.4V, OUT1=5.2V. IN1 changed from 0.2 to 1.4V, i.e. a change of 1.2V. OUT1 changed from 0.2 to 5.2V, i.e. a change of 5.0V. Therefore, a change of 1.2V in IN1 has caused a change of 5.0V in OUT1 which is in the same direction. The phase behavior of the gain block is specified as OUT1 in-phase IN1. Since the phase is correct the next check is to determine if the gains are okay. The gain relation of delta OUT=1 * delta IN1 is not satisfied by the values of delta OUT1 being 5.0 and delta IN1 being 1.2. The next check is to determine if actual gain is greater than expected gain. The actual delta OUT was expected to be 1.2 and was more than 1.2. Therefore, a check of power and control is invoked. Assuming control and power is good, the gain block is deemed to be faulty.

It will be understood by those having skill in the art that other schemes may be employed to evaluate phase, gain, and compliance constraints according to the present invention. The above processing has been described in detail to illustrate the genericness of the modelling scheme of the present invention. Almost all known circuit components at all functional abstraction levels may be modelled.

Functional Test Plan

Referring again to FIG. 3, the test plan editor 36, and the use of the functional test plan for troubleshooting according to the present invention will now be described. As will be understood by those having skill in the art, a test plan is typically specified by the circuit designer or a test engineer familiar with the circuit. Two types of tests typically exist in the test plan: specific component functionality tests and overall circuit performance tests. Circuit performance tests ensure the functionality of the entire circuit. Component functionality tests insure the performance of a few key components of the circuit. The art has heretofore suggested the use of only specific component functionality tests as part of a troubleshooting system. However, such specific component functionality tests are very easy to model, and in fact failure of a component functionality test often renders the need for an electronic troubleshooting system unnecessary.

The use of overall circuit performance tests have not heretofore been employed as part of a troubleshooting system. These tests represent the designer's knowledge on how an operational unit should perform. According to the invention, these tests are employed as the first step in troubleshooting a unit under test. It will be shown that the present invention does not require any extra information for troubleshooting which is not otherwise given by the test engineer to the technician in case of manual troubleshooting.

A test plan is an ordered set of tests which, if passed, ensure the functional correctness of a unit or circuit. The tests are conducted one after the other in a predetermined order. If all tests pass, the circuit is declared functionally OK. If any test fails, the circuit must be diagnosed so that the defect may be found and corrected.

Each test in a test plan is set of instructions which specifies the input conditions for conducting the test and the expected output conditions. For overall circuit performance tests, the test plan does not contain instructions on how to troubleshoot a circuit once a test fails. Each test typically contains the following information:
(1) Test Number and/or Test Name (for identification purposes)
(2) Test set-up information so that the test may be conducted
(3) Expected output information for determining whether the test has passed or failed
(4) Type of test A typical test from a test plan specification document may be as follows:

"4.2 Individual Channel DC Test: The PA hybrid shall be connected as shown in FIG. 1 and shall operate in a manner such that each channel shall be tested from INx (note: there are 10 channels in the PA hybrid. Therefore x can be anywhere from 1 to 10) to BUFFER-OUT with a static mux address. The SAMPLE and DB lines shall be in the 1-state. The MDAC shall be selected and shall have the maximum gain of 11111111 written into memory according to the procedures of paragraph 5.1 and Table 1.
In order to conduct the test apply +1.00+/−0.05 VDC at INx and connect TID and IRTNB to analog ground. The BUFFER-OUT shall be 0.0+/−0.030 VDC."

Referring the above example to the information described above for a typical test:
(1) The test number is "4.2.X—where X can be any integer from 1-10" and the test name is "Individual Channel DC Test".
(2) The test contains the following set-up information: Node INx must have a voltage of +1.00+/−0.05 VDC. Node TID must have a voltage of 0 (ground) VDC. Node IRTNB must have a voltage of 0 (ground) VDC. GAIN WORD must have the state 11111111. Node SAMPLE must have a state of 1. Node DB must have a state of 1.
(3) The test contains the following expected output information:
The Node BUFFER-OUT must have a voltage of +0.0+/−0.030 VDC.
(4) The type of the test is a DC Test.

Some information required for troubleshooting may be known to the test engineer and may be made known to the test technician in the form of "troubleshooting aids". Troubleshooting aids are the "tips" or other information which is passed from test engineer to the technician in order to help the technician in diagnosis. Troubleshooting aids typically contain the following information:

(a) General Information: Basic information about the purpose of test so that the technician can relate the test number and test name to its functionality.

(b) Expected Normal Voltages on most internal nodes of a correctly working circuit. This helps the technician obtain a limited understanding of the circuit and the test.

(c) The Module or Component which a test is designed to test. This information associates the particular functional test with a particular functional abstraction block. This helps localize the failure to a small group of components directly without searching the whole circuit. In general, the unit-being-tested is highest level functional block, that is the whole circuit. In the above example, the unit-being-tested would be the PA hybrid. However, some tests are meant to test only known components like a capacitor. Other tests are meant to test other functional abstraction blocks like a differential amplifier.

(d) Test Organization Information contains the fact that a similar test may be conducted several times on different functional units. For example, in the above example the test may be conducted 10 times, one for each channel from 1 to 10. Therefore, the test may be named 4.2.1–4.2.10 according to the channel number. The purpose of organizing tests is to give all the common information about similar tests at one place instead of repeating the information several times.

According to the invention, a test plan editor 36 (FIG. 3) is provided to capture all the information necessary for the detection of a fault and subsequent diagnosis in case of a failed test. Therefore, the system of the present invention must be told all the information contained in the test plan for the detection of fault and the information contained in test-engineer's troubleshooting aids so that it can be used for effective troubleshooting. The information which is captured using the test plan editor is employed to perform the following functions:

(1) Guide the user through tests in correct order,
(2) Present test-setup information to the technician or set instruments,
(3) Perform fault detection, and
(4) Perform troubleshooting or diagnosis.

Each of the above functions are explained below:

(1) Test Plan Guide

This function initiates start up and guides the user through tests in the correct order. It employs the ordered set of tests (test numbers) contained in the test plan. This function also provides a facility for the technician to pick up the next test to perform by using the ordered set of tests contained in the test plan. Information regarding the current test, completed tests, and tests to be completed is also presented. General information regarding each test may be presented by using the general information contained in the troubleshooting aids. Finally the tests which pass and fail are recorded.

(2) Test Set-Up Presentation

This function presents the test set-up for each test. Set-ups for voltages or other quantities on different nodes are presented so that the test may be executed. This function uses the test set-up information contained in each test.

(3) Perform Fault Detection

This function presents the expected outputs for each test. Expected outputs for voltages or other quantities on different nodes may be presented so that the technician may determine if the test passed or failed. This function uses the expected output information contained in each test.

(4) Perform Test Diagnosis

This function employs the troubleshooting strategies described below to determine the cause of the test failure. This function employs the general description, the module being tested information, the type of the test (AC or DC), the information about test organization and the information about expected voltages on internal nodes in order to automatically troubleshoot.

Figure 9C:
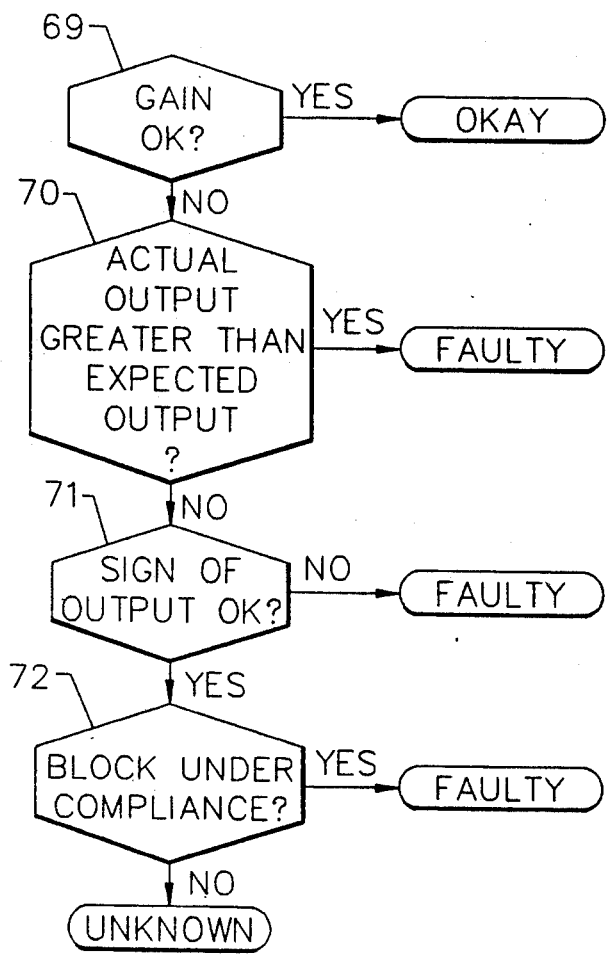
Figure 9D:
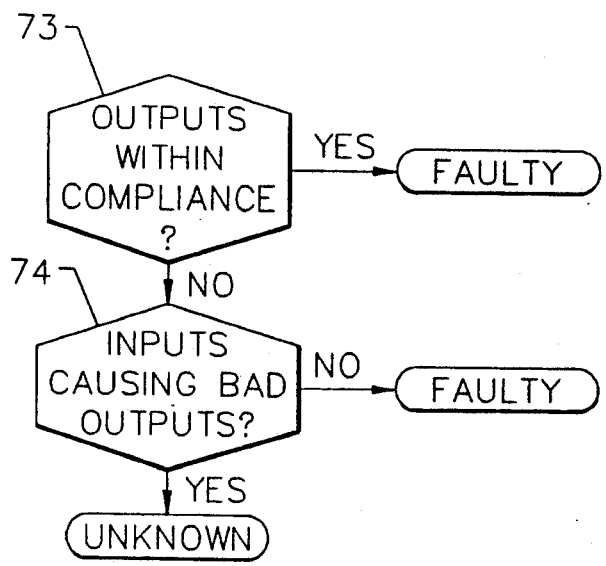

FIGS. 9a and 9b illustrate menu screens which may be employed according to the present invention to capture test plan data. FIG. 9a illustrates data which may be captured when a technician runs the tests manually on workstation 10d (FIG. 1). FIG. 9b illustrates data which may be captured when an automatic test equipment (ATE) runs the tests on workstation 10e (FIG. 1).

Search Strategies

As has been heretofore described, the behavioral evaluator 39 of the DM 17 (FIG. 4) employs unique search strategies 43 which operate upon the circuit knowledge base 22 to troubleshoot a unit under test. As has also been heretofore described, the test plan is employed to begin testing at a failed functional abstraction level, if possible. The search strategy is employed to narrow the failed components to lower and lower functional abstraction levels until a faulty component is isolated.

There are two major assumptions on the hierarchical functional abstraction level architecture. First, a fault in an electronic component or connector may be propagated upward through the functional modules of the functional abstraction levels. Thus, a fault at a lower level will be visible at higher levels. Second, since the functional modules are not evaluated according to adherence to their normal voltages, the behavioral constraints must be robust enough to detect faults at each functional module. The use of behavioral constraint modelling according to the present invention satisfies this criteria. With these assumptions, and with the circuits so neatly partitioned, the search strategy needs only to determine the sequence and method of module evaluation.

Module evaluation may start with the module on the highest abstraction level. This module may be the unit under test itself, if the functional test plan execution has not identified a lower abstraction block for evaluation. Alternatively, if the functional test has identified a lower abstraction block as faulty, unit evaluation begins at that block. From the initial block, the direction of the search is determined by the tested module's behavior. If a module has been determined faulty, because it violates its behavioral constraints, then the search proceeds to the next lower abstraction level by selecting the submodule which has the same output connectors as the tested module. If the tested module has more than one output, the output with the most varying voltage is searched first.

Each time the search drops to a lower abstraction level, the fault becomes narrowed to a smaller group of components. If a module is behaving normally, then the search proceeds to the next adjacent module on the same abstraction level. An adjacent module is defined as a module which has as an output node which is the same as an input node of the tested module. Once again, if the tested module has more than one input, the input with the most varying voltage is searched first. If the behavior of a module is indeterminate, i.e. it cannot be diagnosed as faulty or good, its sub-modules will be checked after all other same level functional abstraction level modules of the tested modules are checked.

When the sub-modules of a faulty functional abstraction level module are LRU's, a search based upon a knowledge of failure modes of components may be employed. The LRU's may be sorted into a prioritized order and evaluated until the faulty LRU is identified. Alternatively a search based upon component types may be employed. For example, active components such as transistors may be tested prior to passive components such as resistors. If a faulty LRU is not found, the search backtracks to the faulty functional abstraction level module and evaluates its adjacent module.

There may be an additional check for faulty modules. Before proceeding to the next lower level, the control and power inputs for the faulty module may be checked. If any control or power input has an incorrect voltage, the sources of the incorrect inputs are evaluated.

Figure 10:
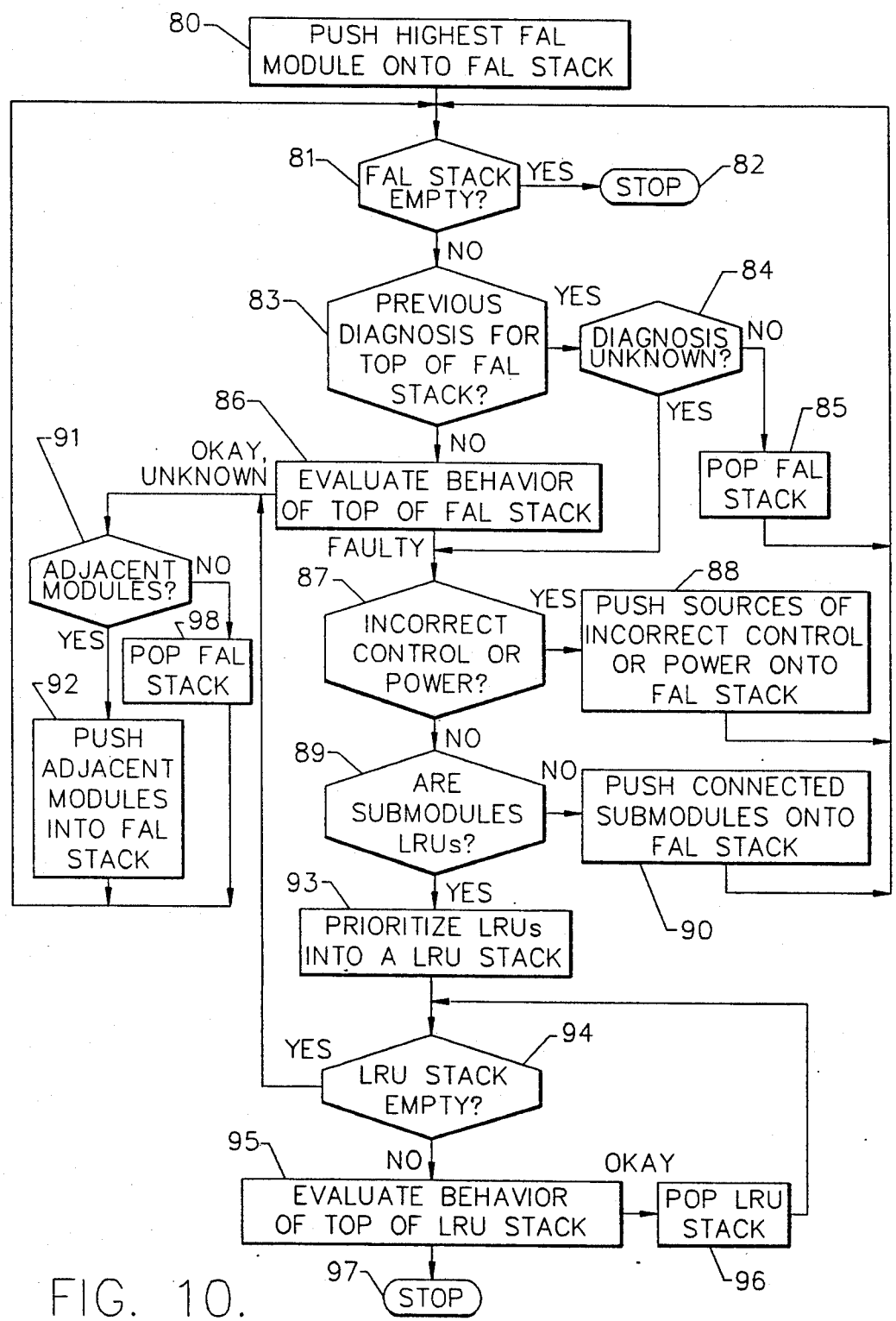
FIG. 10 illustrates a flowchart implementation of a search strategy according to the present invention.

Referring now to FIG. 10, a flowchart implementation of a search strategy according to the present invention will be described. The flowchart employs a stack to store the next module to be tested and to enable backtracking. The use of stacks is well known to those having skill in the art and need not be described in detail. The flowchart of FIG. 11 employs two stack operations, i.e. PUSH and POP stack. The PUSH operation takes a given module or list of modules and places them on the stack, beginning at the top of the stack. The POP operation removes the top module from a stack and moves each succeeding module up one position in the stack.

Referring now to FIG. 10, the search begins by pushing the highest Functional Abstraction Level (FAL) module onto an FAL stack (Block 80). As described above, the highest FAL module may be the unit under test itself or may be module identified as having failed the test plane. The search stops when the FAL stack is empty (Block 81), or when a faulty LRU is located.

When the FAL stack is not empty, the module at the top of the FAL stack is processed. First, a test is made at Block 83 as to whether a previous diagnosis has been determined for the module. This test is performed to further search modules which had been initially diagnosed as unknown (indeterminate). If the module had been previously diagnosed and has unknown behavior (Block 84), then the search treats this module as being faulty, and proceeds to Block 87, which is described below. If the module has been previously diagnosed and does not have indeterminate behavior, then that module is popped off the FAL stack, and control returns to Block 81.

If there was no previous diagnosis for the module at the top of the FAL stack (Block 83), then the behavior of this module is evaluated (Block 86). The behavior of the module is evaluated by processing the behavioral constraints for that module using the voltage measurements from its terminals. If the behavior is either okay or unknown (indeterminate), the search will proceed to the adjacent modules of the just tested module. To do this, a test is made for the existence of adjacent modules of the just tested module (Block 91). If adjacent modules exist, then the adjacent modules are pushed onto the FAL stack (Block 92) and control returns to Block 81. If there are no adjacent modules, the just tested module is popped off the FAL stack and control returns to Block 81.

If the behavior of the just tested module is faulty (Block 86), the control and power inputs of the module will be checked. If the control and power inputs are incorrect (Block 88), the module sources of the incorrect control or power inputs are pushed onto the FAL stack, and control returns to Block 81. If the control and power are correct, then the search will proceed to the sub-modules of the just tested module. To do this, a test is made at Block 89, to determine whether sub-modules of the just tested modules are LRUs (lowest level components). If the sub-modules are not LRUs, then the sub-module connected to the just tested module's output is pushed onto the FAL stack (Block 90) and control returns to Block 81. If the sub-modules of the just tested module are LRUs, then a new stack is created. The LRU sub-modules are prioritized and pushed onto the newly created LRU stack at Block 93. The LRU stack is processed until the stack is empty or until a faulty LRU is found. While the LRU stack is not empty, the behavior of the LRU at the top of the LRU stack is evaluated at Block 95. If the LRU's behavior is found to be faulty, processing stops at Block 97 since the faulty LRU has been isolated. If the LRU's behavior is okay or unknown (indeterminate), the LRU is popped off the LRU stack at Block 96, and control returns to Block 94. If the LRU stack becomes empty without finding a faulty LRU, then the search backtracks to test the adjacent FAL modules of the most recently declared faulty FAL module, and control passes to Block 91.

Troubleshooting Process

Referring now to FIGS. 11a-11d the troubleshooting process according to the present invention will now be described. The troubleshooting process will be described from the viewpoint of the technician who employs the system of the present invention to troubleshoot an electronic unit. The process will be described in connection with a workstation 10d which is directly connected to test equipment 12d and includes a display 15d (see FIG. 1). It is assumed that the configuration process described above has been performed so that a physical layout, schematic diagram and test plan have already been entered into the system and the system has been configured. The DM then employs the circuit knowledge base 22 and the electronics knowledge base 23 to locate a fault in the unit. The DM employs the search strategy which has been described above. However, all of the above processing is transparent to the troubleshooting technician. The technician is merely presented with a physical layout diagram, a schematic diagram and instructions to measure particular voltages or perform other tests.

FIGS. 11a-11d illustrate screen layouts which may be employed for technician display 15d (FIG. 1) to direct the technician to perform tests to troubleshoot an electronic unit. All the screens may include three main screen areas. The top area is a physical layout diagram of the unit under test. A "probe" symbol indicates to the technician where a measurement is to be made to perform a particular test. The schematic diagram section of the screen at the lower right illustrates the functional block which is presently being tested by the system. The system response window at the lower left indicates the system instructions to the technician and the results of technician measurements.

Figure 11A:
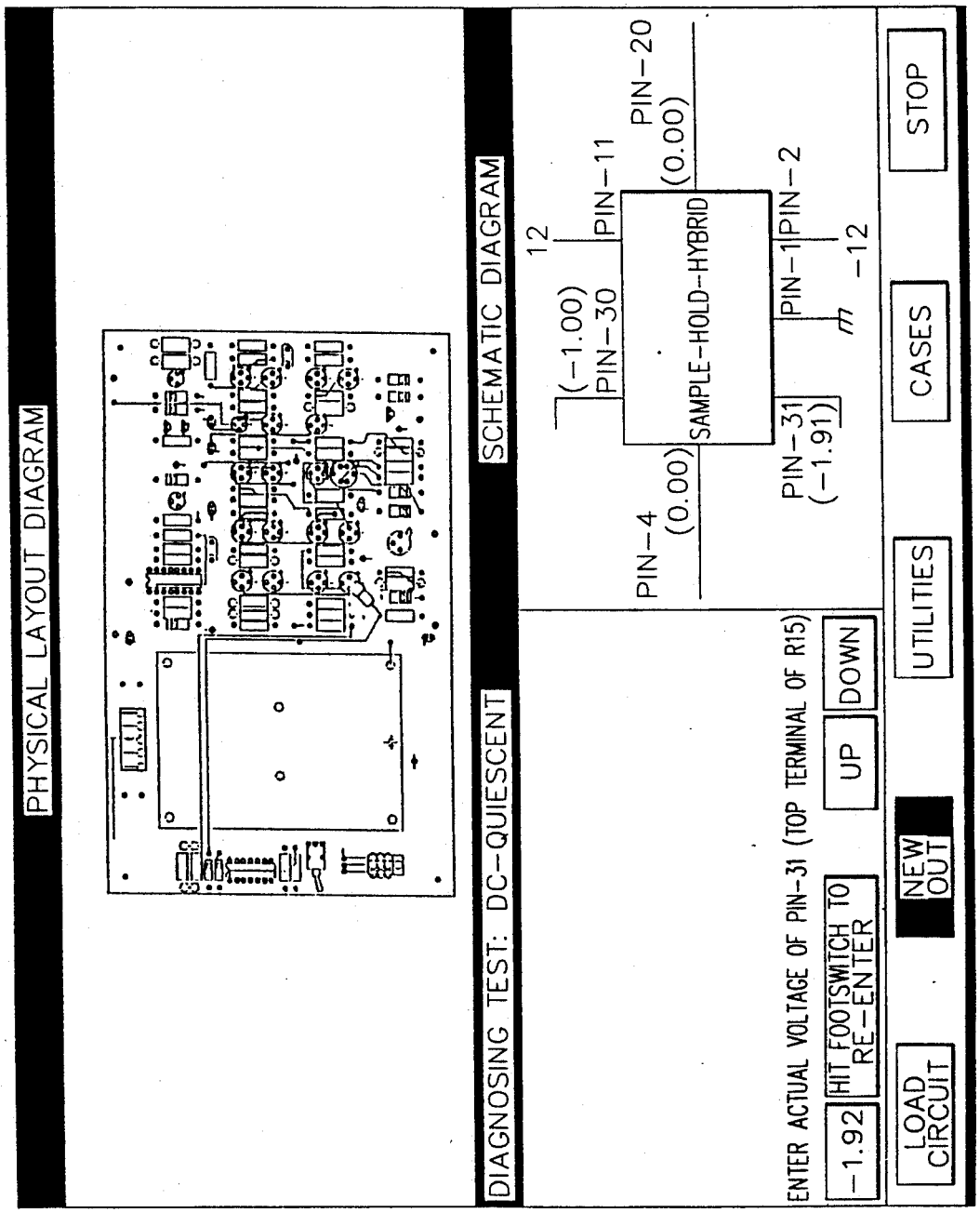
Figure 11B:
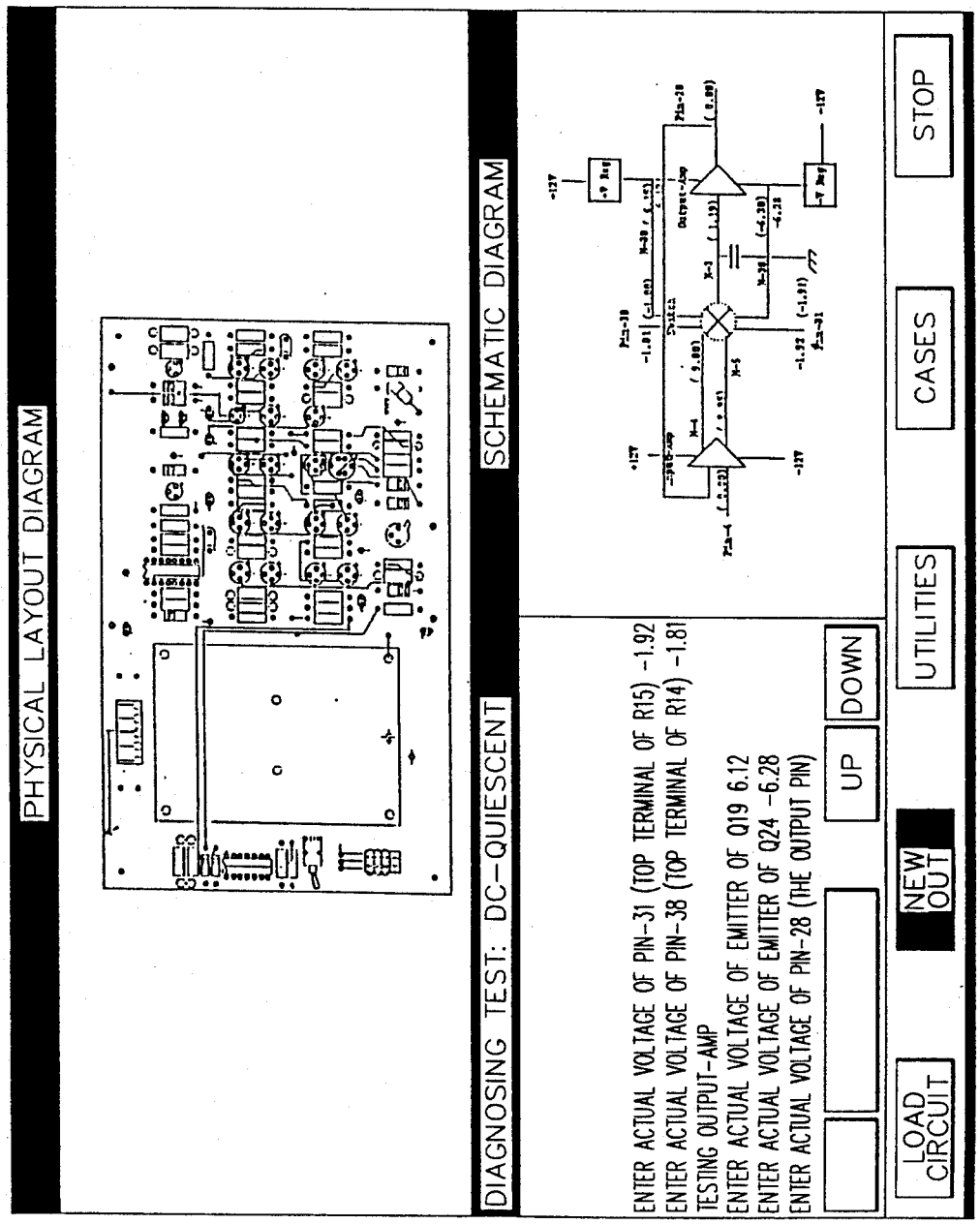
Figure 11D:
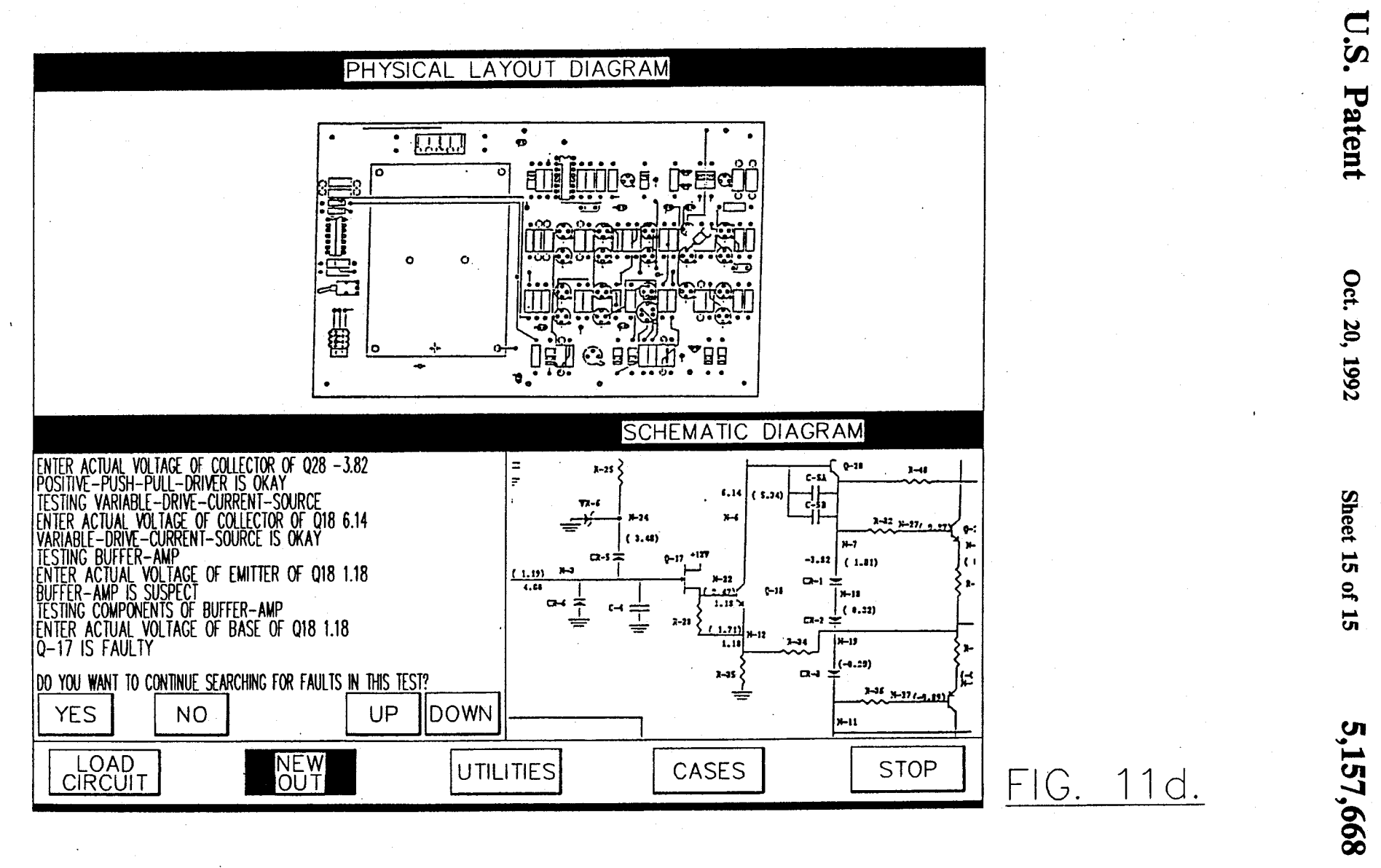

As described above, testing begins by executing the test plan until a test fails. FIG. 11a assumes that an overall functional test has failed so that the highest functional abstraction block being tested is the entire unit. For purposes of this example the unit illustrated in the physical layout diagram section is a sample-hold hybrid unit. Under direction of the search strategies described above troubleshooting proceeds to a next lower functional abstraction level shown in FIG. 11b. Again the system directs the technician to enter voltages and accepts voltages being entered. Referring to FIG. 11c, still a next lower functional abstraction level is tested as the potentially defective component is further isolated. FIG. 11d illustrates to lowest (LRU) functional level in which individual components are being tested. The system response window indicates that Q17 has been found to be faulty.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A computer based method of characterizing an electronic circuit having a plurality of interconnected electronic circuit components, comprising the steps of:
   storing in said computer, a representation of said electronic circuit including said plurality of interconnected electronic circuit components;
   determining, for at least one of said electronic circuit components, incremental changes in selected outputs thereof which result from incremental changes in selected inputs thereto; and
   storing in said computer, for said at least one of said electronic circuit components, said determined incremental changes in selected outputs thereof which result from said incremental changes in selected inputs thereto;
   wherein said at least one of said electronic circuit components include primitive circuit components, and
   wherein said at least one of said electronic circuit components further include intermediate and high level circuit components.

2. The method of claim 1 wherein said incremental changes in selected outputs comprise one of an increase and decrease in said selected outputs and wherein said incremental changes in selected inputs comprise one of an increase and decrease in said selected inputs.

3. A computer based method of characterizing an electronic circuit having a plurality of interconnected electronic circuit components, comprising the steps of:
   storing in said computer, a representation of said electronic circuit including said plurality of interconnected electronic circuit components;
   determining, for at least one of said electronic circuit components, incremental changes in selected outputs thereof which result from incremental changes in selected inputs thereto; and
   storing in said computer, for said at least one of said electronic circuit components, said determined incremental changes in selected outputs thereof which result from said incremental changes in selected inputs thereto;
   wherein said incremental changes in selected outputs thereof which result from incremental changes in selected inputs thereto comprise a series of IF-THEN statements in the form IF (input change 1, input change 2 . . . input change n) THEN (output change 1, output change 2 . . . output change n), wherein input change 1, input change 2 . . . input change n represent said incremental changes in said selected inputs and output change 1, output change 2 . . . output change n represent said incremental changes in said selected outputs.

4. A computer based method of characterizing an electronic circuit having a plurality of interconnected electronic circuit components, comprising the steps of:
   storing in said computer, a representation of said electronic circuit including said plurality of interconnected electronic circuit components;
   determining, for at least one of said electronic circuit components, incremental changes in selected outputs thereof which result from incremental changes in selected inputs thereto; and
   storing in said computer, for said at least one of said electronic circuit components, said determined incremental changes in selected outputs thereof which result from said incremental changes in selected inputs thereto;
   wherein said incremental changes in selected outputs thereof which result from incremental changes in selected inputs thereto comprise a series of statements in the form (input 1, input 2 . . . input n) IN PHASE/OUT OF PHASE (output 1, output 2 . . . output n), where input 1, input 2 . . . input n represent said selected inputs and output 1, output 2 . . . output n represent said selected outputs.

5. A computer based method of characterizing an electronic circuit having a plurality of interconnected electronic circuit components, comprising the steps of:
   storing in said computer, a representation of said electronic circuit including said plurality of interconnected electronic circuit components;
   determining, for at least one of said electronic circuit components, incremental changes in selected outputs thereof which result from incremental changes in selected inputs thereto;
   storing in said computer, for said at least one of said electronic circuit components, said determined incremental changes in selected outputs thereof which result from said incremental changes in selected inputs thereto; and
   storing in said computer, for said at least one of said electronic circuit components at least one gain between selected outputs thereof and selected inputs thereof.

6. A computer based method of characterizing an electronic circuit having a plurality of interconnected electronic circuit components, comprising the steps of:
   storing in said computer, a representation of said electronic circuit including said plurality of interconnected electronic circuit components;
   determining, for at least one of said electronic circuit components, incremental changes in selected outputs thereof which result from incremental changes in selected inputs thereto;

storing in said computer, for said at least one of said electronic circuit components, said determined incremental changes in selected outputs thereof which result from said incremental changes in selected inputs thereto; and storing in said computer, for at least one of said electronic circuit components at least one compliance thereof.

7. The method of claim 6 wherein said at least one compliance comprises absolute maxima and minima of selected inputs and outputs of said electronic circuit components.

8. The method of claim 6 wherein said at least one compliance comprises a state of said electronic circuit components.

9. A computer based model for circuit components comprising incremental changes in selected outputs of said circuit components which result from incremental changes in selected inputs to said circuit components, said incremental changes in selected outputs and said incremental changes in selected inputs being stored in a computer; wherein said circuit components include primitive circuit components, and wherein said circuit components further include intermediate and high level circuit components.

10. The model of claim 9 wherein said incremental changes in selected outputs comprise one of an increase and decrease in said selected outputs and wherein said incremental changes in selected inputs comprise one of an increase and decrease in said selected inputs.

11. A computer based model for circuit components comprising incremental changes in selected outputs of said circuit components which result from incremental changes in selected inputs to said circuit components, said incremental changes in selected outputs and said incremental changes in selected inputs being stored in a computer; wherein said incremental changes in selected outputs which result from incremental changes in selected inputs comprise a series of IF-THEN statements in the form IF (input change 1, input change 2 . . . input change n) THEN (output change 1, output change 2 . . . output change n), wherein input change 1, input change 2 . . . input change n represent said incremental changes in said selected inputs and output change 1, output change 2 . . . output change n represent said incremental changes in said selected outputs.

12. A computer based model for circuit components comprising incremental changes in selected outputs of said circuit components which result from incremental changes in selected inputs to said circuit components, said incremental changes in selected outputs and said incremental changes in selected inputs being stored in a computer; wherein said incremental changes in selected outputs which result from incremental changes in selected inputs thereto comprise a series of statements in the form (input 1, input 2 . . . input n) IN PHASE/OUT OF PHASE (output 1, output 2 . . . output n), where input 1, input 2 . . . input n represent said selected inputs and output 1, output 2 . . . output n represent said selected outputs.

13. A computer based model for circuit components comprising incremental changes in selected outputs of said circuit components which result from incremental changes in selected inputs to said circuit components, said incremental changes in selected outputs and said incremental changes in selected inputs being stored in a computer and further comprising gains between selected outputs thereof and selected inputs thereof.

14. A computer based model for circuit components comprising incremental changes in selected outputs of said circuit components which result from incremental changes in selected inputs to said circuit components, said incremental changes in selected outputs and said incremental changes in selected inputs being stored in computer and further comprising compliances thereof.

15. The model of claim 14 wherein said compliances comprise absolute maxima and minima of selected inputs and outputs of said circuit components.

16. The model of claim 14 wherein said compliances comprise a state of said circuit components.

17. A computer based method of characterizing an electronic circuit, including a plurality of interconnected electronic components, comprising the steps of:

storing in said computer, a representation of said electronic circuit including said plurality of interconnected electronic components; and providing a library of models in said computer, said library of models comprising primitive, intermediate and high level models, each of said primitive, intermediate and high level models comprising incremental changes in selected outputs thereof which result from incremental changes in selected inputs thereto.

18. The computer based method of claim 17 further comprising the step of:

associating selected ones of said primitive, intermediate and high level models to characterize said electronic circuit.

19. The method of claim 18 wherein said associating step comprises the steps of:

representing said electronic components in terms of selected ones of said primitive models in said library; and representing said electronic circuit in terms of selected ones of said intermediate and high level models in said library.

20. The method of claim 19 wherein the step of representing said electronic circuit comprises the steps of:

representing groups of said electronic components in terms of selected ones of said intermediate models in said library; and representing said plurality of interconnected electronic components in terms of one of said high level models in said library.

21. The method of claim 17 wherein said incremental changes in selected outputs comprise one of an increase and decrease in said selected outputs and wherein said incremental changes in selected inputs comprise one of an increase and decrease in said selected inputs.

22. The method of claim 17 wherein said incremental changes in selected outputs thereof which result from incremental changes in selected inputs thereto comprise a series of IF-THEN statements in the form IF (input change 1, input change 2 . . . input change n) THEN (output change 1, output change 2 . . . output change n), wherein input change 1, input change 2 . . . input change n represent said incremental changes in said selected inputs and output change 1, output change 2 . . . output change n represent said incremental changes in said selected outputs.

23. The method of claim 17 wherein said incremental changes in selected outputs thereof which result from incremental changes in selected inputs thereto comprise a series of statements in the form (input 1, input 2 . . .

input n) IN PHASE/OUT OF PHASE (output 1, output 2 . . . output n), where input 1, input 2 . . . input n represent said selected inputs and output 1, output 2 . . . output n represent said selected outputs.

24. The method of claim 17 wherein said models of electronic components further comprise gain between selected outputs thereof and selected inputs thereof.

25. The method of claims 17 or 24 wherein said models of electronic components further comprise compliances thereof.

26. The method of claim 25 wherein said compliances comprise absolute maxima and minima of selected inputs and outputs of said electronic components.

27. The method of claim 25 wherein said compliances comprise a state of said electronic components.

28. A computer based apparatus for characterizing an electronic circuit including a plurality of interconnected electronic components, comprising:
  means for storing in said computer, a representation of said electronic circuit including said plurality of interconnected electronic components; and
  a library of models in said computer, said library of models comprising primitive, intermediate and high level models, each of said primitive, intermediate and high level models comprising incremental changes in selected outputs thereof which result from incremental changes in selected inputs thereto.

29. The computer based apparatus of claim 28 further comprising:
  means for associating selected ones of said primitive, intermediate and high level models to characterize said electronic circuit.

30. The apparatus of claim 28 wherein said incremental changes in selected outputs comprise one of an increase and decrease in said selected outputs and wherein said incremental changes in selected inputs comprise one of an increase and decrease in said selected inputs.

31. The apparatus of claim 28 wherein said incremental changes in selected outputs which result from incremental changes in selected inputs thereto comprise a series of IF-THEN statements in the form IF (input change 1, input change 2 . . . input change n) THEN (output change 1, output change 2 . . . output change n), wherein input change 1, input change 2 . . . input change n represent changes in said selected inputs and output change 1, output change 2 . . . output change n represent changes in said selected outputs.

32. The apparatus of claim 28 wherein said incremental changes in selected outputs which result from incremental changes in selected inputs thereto comprise a series of statements in the form (input 1, input 2 . . . input n) IN PHASE/OUT OF PHASE (output 1, output 2 . . . output n), wherein put 1, input 2 . . . input n represent said selected inputs and output 1, output 2 . . . output n represent said selected outputs.

33. The apparatus of claim 28 wherein said modules of electronic components further comprise gain between selected outputs thereof and selected inputs thereof.

34. The apparatus of claims 28 or 33 wherein said models of electronic components further comprise compliances thereof.

35. The method of claim 34 wherein said compliances comprise absolute maxima and minima of selected inputs and outputs of said electronic components.

36. The method of claim 34 wherein said compliances comprise a state of said electronic components.

37. The apparatus of claim 28 wherein said means for associating comprises:
  means for representing said electronic components in terms of selected ones of said primitive models in said library; and
  means for representing said plurality of interconnected electronic components in said electronic circuit in terms of selected ones of said intermediate and high level models in said library.

38. The apparatus of claim 37 wherein said means for representing the interconnected electronic components comprises:
  means for representing groups of said electronic components in terms of selected ones of said intermediate models in said library; and
  means for representing said plurality of interconnected electronic components in terms of one of said high level models in said library.

39. A computer based method for locating a fault in an electronic unit having a plurality of interconnected electronic components, comprising the steps of:
  providing a library of models in said computer, said library of models comprising primitive, intermediate and high level models, each of said primitive, intermediate and high level models comprising incremental changes in selected outputs thereof which result from incremental changes in selected inputs thereto;
  associated selected ones of said primitive, intermediate and high level models to form a representation of said electronic unit;
  obtaining measurements of at least one of said plurality of interconnected electronic components; and,
  employing said representation to determine whether said measurements of said at least one of said plurality of interconnected electronic components result from a malfunction of said at least one of said plurality of interconnected electronic components.

40. The method of claim 39 wherein said primitive, intermediate and high level models further comprise gain between selected outputs thereof and selected inputs thereof.

41. The method of claims 39 or 40 wherein said primitive, intermediate and high level models further comprise compliances thereof.

42. The method of claim 41 wherein said compliances comprise the absolute maxima and minima of selected inputs and outputs thereof.

43. The method of claim 41 wherein said compliances comprise a state of said electronic circuit elements.

44. The method of claim 39 wherein said associating step comprises the steps of:
  representing said electronic components in said electronic unit in terms of selected ones of said primitive models in said library and;
  representing the interconnected electronic components in said electronic unit in terms of selected ones of said intermediate and high level models in said library.

45. The method of claim 44 wherein the step of representing the interconnected electronic components comprises the steps of:
  representing groups of said electronic components in terms of selected ones of said intermediate models in said library; and representing said plurality of interconnected electronic elements in terms of one of said high level models in said library.

46. The method of claim 39 wherein said obtaining step comprises the step of:
providing an indication of said at least one of said plurality of interconnected electronic components to be measured; and
accepting measurements of said at least one of said plurality of interconnected electronic components.

47. The method of claim 39 wherein said obtaining step comprises the step of:
directing automatic measuring equipment to measure said at least one of said plurality of interconnected components; and
accepting measurements from said automatic measuring equipment.

48. The method of claim 39 wherein said employing step is followed by the step of:
providing an indication that said at least one of said plurality of interconnected components is malfunctioning if it is determined that changes in the outputs of said at least one of said plurality of interconnected electronic components are as a result of a malfunction of said at least one of said plurality of interconnected electronic components.

49. The method of claim 39 wherein said obtaining and employing steps are repeatedly performed on second and subsequent ones of said plurality of interconnected electronic components if it is determined that changes in the outputs of said at least one of said plurality of interconnected electronic components are not as a result of a malfunction of said at least one of said plurality of interconnected electronic components.

50. The method of claim 39 wherein said obtaining and employing steps are repeatedly performed on said at least one of said plurality of interconnected electronic components if it is determined that changes in the outputs of said at least one of said plurality of interconnected electronic components are as a result of a malfunction of said at least one of said plurality of interconnected electronic components, in order to locate the malfunction in one of said at least one of said plurality of interconnected electronic components.

51. The method of claim 50 wherein said intermediate and primitive models are employed during the repeated performance of said obtaining and employing steps in order to locate the malfunction in said one of said plurality of interconnected electronic components.

52. A computer based apparatus for locating a fault in an electronic unit having a plurality of interconnected electronic circuit components, comprising:
means for providing a library of models in said computer, said library of models comprising primitive, intermediate and high level models, each of said primitive, intermediate and high level models comprising incremental changes in selected outputs thereof which result from incremental changes in selected inputs thereto;
means for associating selected ones of said primitive, intermediate and high level models to form a representation of said electronic unit;
means for obtaining measurements of at least one of said plurality of interconnected electronic components; and,
means connected to said associating means, for determining whether said measurements of said at least one of said plurality of interconnected electronic components are as a result of a malfunction of said at least one of said plurality of interconnected electronic components.

53. The apparatus of claim 52 wherein said primitive, intermediate and high level models further comprise gain between selected outputs thereof and selected inputs thereof.

54. The apparatus of claims 52 or 53 wherein said primitive, intermediate and high level models further comprise compliances thereof.

55. The method of claim 54 wherein said compliances comprise absolute maxima and minima of selected inputs and outputs thereof.

56. The method of claim 54 wherein said compliances comprise a state of said electronic circuit elements.

57. The apparatus of claim 52 wherein said means for associating comprises:
means for representing said electronic components in said electronic unit in terms of selected ones of said primitive models in said library and;
means for representing the interconnected electronic components in said electronic unit in terms of selected ones of said intermediate and high level models in said library.

58. The apparatus of claim 57 wherein said means for representing the interconnected electronic components comprises:
means for representing groups of said electronic components in terms of selected ones of said intermediate models in said library; and
means for representing said electronic unit in terms of one of said high level models in said library.

59. The apparatus of claim 52 wherein said means for obtaining comprises:
means for providing an indication of said at least one of said plurality of interconnected electronic components to be measured; and
means for accepting measurements of said at least one of said plurality of interconnected electronic components.

60. The apparatus of claim 52 wherein said means for obtaining comprises:
means for directing automatic measuring equipment to measure said at least one of said plurality of interconnected components; and
means for accepting measurements from said automatic measuring equipment.

61. The apparatus of claim 52 further comprising:
means for providing an indication that said at least one of said plurality of interconnected components is malfunctioning if it is determined that changes in the outputs of said at least one of said plurality of interconnected electronic components are as a result of a malfunction of said at least one of said plurality of interconnected electronic components.

62. The apparatus of claim 52 wherein said means for obtaining and means for determining repeatedly operate upon second and subsequent ones of said plurality of interconnected electronic elements if it is determined that changes in the outputs of said at least one of said plurality of interconnected electronic components are not as a result of a malfunction of said at least one of said plurality of interconnected electronic components.

63. The apparatus of claim 52 wherein said means for obtaining and means for determining repeatedly operate upon said at least one of said plurality of interconnected electronic components if it is determined that changes in the outputs of said at least one of said plurality of interconnected electronic components are as a result of a malfunction of said at least one of said plurality of interconnected electronic components, in order to locate the malfunction in one of said at least one of said plurality of interconnected electronic components.

64. A computer based method for isolating a fault in a unit under test, said unit under test comprising a plurality of interconnected electronic circuit components, comprising the steps of:
   (a) providing in said computer a hierarchical decomposition of said unit under test, said hierarchical decomposition comprising a plurality of blocks each of which includes at least one input and at least one output, said blocks being arranged in a plurality of functional abstraction levels from low to high, each lowest functional abstraction level block corresponding to a respective one of said electronic circuit components, each higher functional abstraction level block including at least one next lower functional abstraction level block;
   (b) testing the electronic circuit components corresponding to a selected block to determine if said selected block is faulty;
   (c) if said selected block is faulty, testing the electronic circuit components corresponding to a first block in a next lower functional abstraction level from said selected block, said first block having an output which corresponds to an output of said selected block;
   (d) if the first block in said next lower functional abstraction level is not faulty, testing the electronic circuit components corresponding to an adjacent block in said next lower functional abstraction level;
   (e) repeating step (d) until a faulty next lower functional level block is found;
   (f) testing the electronic circuit components corresponding to a second block in a next lower functional abstraction level from said faulty next lower functional level block, said second block having an output which corresponds to an output of said faulty next lower functional abstraction level block; and
   (g) repeatedly performing steps (d), (e) and (f) until a faulty circuit component is found.

65. The method of claim 64 wherein said step (c) is preceded by the step of selecting said first block from the set of all blocks in said next lower functional abstraction level having an output which corresponds to an output of said selected block, according to predetermined selection criteria.

66. The method of claim 65 wherein said predetermined selection criteria comprise an ordered list of blocks to be selected, based upon the electronic components included in said blocks.

67. The method of claim 66 wherein said ordered list of blocks to be selected is based upon known failure modes of the electronic elements included in said blocks.

68. The method of claim 64 wherein said adjacent block comprises a block in said next lower functional abstraction level, having an output which corresponds to an input of said first block in said next lower functional abstraction level.

69. The method of claim 64 wherein a prioritized search is performed at said lowest functional abstraction level.

70. The method of claim 64 wherein step (d) is performed if said first block is not faulty, or if it cannot be determined whether said first block is faulty.

71. The method of claim 70 wherein step (f) comprises the step of testing the electronic circuit components corresponding to a second block in a next lower functional level from said faulty next lower level block, or if a faulty next lower level block has not been identified, testing the electronic circuit components corresponding to a second block in a next lower functional level from the block which cannot be determined as faulty.

72. The method of claim 64 wherein said step (b) is preceded by the step of determining a selected block for testing.

73. The method of claim 72 wherein said determining step comprises the steps of:
   storing a representation of a functional test plan for said unit under test in said computer, said representation of said functional test plan including a correlation between a respective one of the functional tests and at least one of said plurality of blocks being tested by the respective one of said functional tests; and
   applying said functional test plan to said unit under test to determine said selected block.

74. The method of claim 73 wherein said applying step comprises applying the tests specified in said functional test plan to said unit under test, in the order specified by said functional test plan.

75. The method of claim 73 wherein said applying step comprises the steps of:
   providing an indication of a functional test to be performed on said unit under test; and
   accepting measurements of the results of said functional test.

76. The method of claim 73 wherein said applying step comprises the steps of:
   directing automatic test equipment to perform a first functional test on said unit under test; and
   accepting the results of said first functional test from said automatic test equipment.

77. The method of claim 64 wherein each of said plurality of blocks in said hierarchical decomposition further comprises incremental changes in selected outputs thereof which result from incremental changes in selected inputs thereto.

78. The method of claim 77 wherein said incremental changes in selected outputs comprise one of an increase and decrease in said selected outputs and wherein said incremental changes in selected inputs comprise one of an incremental increase and decrease in said selected inputs.

79. The method of claim 77 wherein said incremental changes in selected outputs thereof which result from incremental changes in selected inputs thereto comprise a series of IF-THEN statements in the form IF (input change 1, input change 2 . . . input change n) THEN (output change 1, output change 2 . . . output change n), wherein input change 1, input change 2 . . . input change n represent said incremental changes in said selected inputs and output change 1, output change 2 . . . output change n represent said incremental changes in said selected outputs.

80. The method of claim 77 wherein said incremental changes in selected outputs thereof which result from incremental changes in selected inputs thereto comprise a series of statements in the form (input 1, input 2 . . .

input n) IN PHASE/OUT OF PHASE (output 1, output 2 . . . output n), where input 1, input 2 . . . input n represent said selected inputs and output 1, output 2 . . . output n represent said selected outputs.

81. The method of claim 80 wherein said models of electronic circuit components further comprise gain between selected outputs thereof and selected inputs thereof.

82. The method of claims 80 or 81 wherein said models of electronic circuit components further comprise compliances thereof.

83. The method of claim 82 wherein said compliances comprise absolute maxima and minima of selected inputs and outputs thereof.

84. The method of claim 82 wherein said compliances comprise a state of said electronic circuit elements.

85. A computer system for isolating a fault in a unit under test, said unit under test comprising a plurality of interconnected electronic circuit components comprising:
means for storing in said computer a hierarchical decomposition of said unit under test, said hierarchical decomposition comprising a plurality of blocks each of which includes at least one input and at least one output, said blocks being arranged in a plurality of functional abstraction levels from low to high, each lowest functional abstraction level corresponding to a respective one of said electronic circuit components, each higher functional abstraction level block including at least one next lower functional abstraction level block;
first means for directing testing of the electronic circuit components corresponding to a selected block to determine if said selected block is faulty;
second means, connected to said first means, for directing testing the electronic circuit components corresponding to a first block in a next lower functional abstraction level from said selected block, said first block having an output which corresponds to an output of said selected block, if said first means indicates that said selected block is faulty; and
third means, connected to said first means, for directing testing of the electronic circuit components corresponding to an adjacent block in said next lower functional abstraction level, if said first means indicates that said selected block is not faulty.

86. The system of claim 85 wherein said first block is selected from the set of all blocks in said next lower functional abstraction level having an output which corresponds to an output of said selected block, according to predetermined selection criteria.

87. The system of claim 86 wherein said predetermined selection criteria comprise an ordered list of blocks to be selected, based upon the electronic components included in said blocks.

88. The system of claim 86 wherein said predetermined selection criteria comprise an ordered list of blocks to be selected, based upon known failure modes of the electronic elements included in said blocks.

89. The system of claim 85 wherein said adjacent block comprises a block in said next lower functional abstraction level, having an output which corresponds to an input of said first block in said next lower functional abstraction level.

90. The system of claim 85 wherein said first means further comprises means for determining said selected block for testing.

91. The system of claim 90 wherein said means for determining comprises:
means for storing a representation of a functional test plan for said unit under test in said computer, said representation of said functional test plan including a correlation between a respective one of the functional tests and at least one of said plurality of blocks being tested by the respective one of said functional tests; and
means for applying said functional test plan to said unit under test to determine said selected block.

92. The system of claim 91 wherein said applying means comprises means for applying the tests specified in said functional test plan to said unit under test, in the order specified by said functional test plan.

93. The system of claim 91 wherein said applying means comprises:
means for providing an indication of a functional test to be performed on said unit under test; and
means for accepting measurements of the results of said functional test.

94. The system of claim 91 wherein said applying means comprises:
means for directing automatic test equipment to perform a first functional test on said unit under test; and
means for accepting the results of said first functional test form said automatic test equipment.

95. The system of claim 85 wherein each of said blocks further comprises incremental changes in selected outputs thereof which result from incremental changes in selected inputs thereto.

96. The system of claim 95 wherein said incremental changes in selected outputs comprise one of an increase and decrease in said selected outputs and wherein said incremental changes in selected inputs comprise one of an increase and decrease in said selected inputs.

97. The system of claim 95 wherein said incremental changes in selected outputs thereof which result from incremental changes in selected inputs thereto comprise a series of IF-THEN statements in the form IF (input change 1, input change 2 . . . input change n) THEN (output change 1, output change 2 . . . output change n), wherein input change 1, input change 2 . . . input change n represent incremental changes in said selected inputs and output change 1, output change 2 . . . output change n represent incremental changes in said selected outputs.

98. The method of claim 95 wherein said incremental changes in selected outputs thereof which result from incremental changes in selected inputs thereto comprise a series of statements in the form (input 1, input 2 . . . input n) IN PHASE/OUT OF PHASE (output 1, output 2 . . . output n), where input 1, input 2 . . . input n represent said selected inputs and output 1, output 2 . . . output n represent said selected outputs.

99. The method of claim 98 wherein said models of electronic circuit components further comprise gain between selected outputs thereof and selected inputs thereof.

100. The method of claims 95 or 98 wherein said models of electronic circuit components further comprise compliances thereof.

101. The method of claim 100 wherein said compliances absolute maxima and minima of selected inputs and outputs thereof.

102. The method of claim 100 wherein said compliances comprise a state of said electronic circuit elements.

103. A computer based method for initiating automated troubleshooting of a unit under test, said unit under test comprising a plurality of interconnected electronic circuit components, said method comprising the steps of:

storing in said computer a hierarchical decomposition of said unit under test, said hierarchical decomposition comprising a plurality of blocks each of which at least one input and at least one output, said blocks being arranged in a plurality of functional abstraction levels from low to high, each lowest functional abstraction level block corresponding to a respective one of said electronic circuit components, each higher functional abstraction level block including at least one next lower functional abstraction level block;

storing a functional test plan for the unit under test in said computer;

associating a respective one of the functional tests in said functional test plan with at least one of said plurality of blocks being tested by the respective one of the functional tests;

causing the functional tests specified in said functional test plan to be performed on said unit under test until one of the functional tests fails; and, performing troubleshooting of said electronic circuit components corresponding to the block associated with the failed functional test.

104. The method of claim 103 wherein said causing step comprises the step of:

causing the functional tests specified in said functional test plan to be performed in the sequence specified by said functional test plan.

105. The method of claim 103 wherein said causing step comprises the steps of:

providing an indication of a functional test to be performed on said unit under test; and accepting measurements of the results of said functional test.

106. The method of claim 103 wherein said causing step comprises the steps of:

directing automatic test equipment to perform a functional test on said unit under test; and accepting the results of said functional test from said automatic test equipment.

107. A computer based apparatus for initiating automated troubleshooting of a unit under test, said unit under test comprising a plurality of interconnected electronic circuit components, said apparatus comprising:

means for storing in said computer a hierarchical decomposition of said unit under test, said hierarchical decomposition comprising a plurality of blocks each of which includes at least one input and at least one output, said blocks being arranged in a plurality of functional abstraction levels from low to high, each lowest functional abstraction level block corresponding to a respective one of said electronic circuit components, each higher functional abstraction level block including at least one next lower functional abstraction level block;

means for storing a functional test plan for the unit under test in said computer;

means for associating a respective one of the stored functional tests in said functional test plan with at least one of said plurality of blocks being tested by the respective one of the functional tests;

means for causing the functional tests specified in said functional test plan to be performed on said unit under test until one of said functional tests fails; and, means for initiating troubleshooting of said electronic circuit components corresponding to the block associated with the failed functional test.

108. The apparatus of claim 107 wherein said means for causing comprises:

means for causing the functional tests specified in said functional test plan to be performed in the sequence specified by said functional test plan.

109. The apparatus of claim 107 wherein said means for causing comprises:

means for providing an indication of a functional test to be performed on said unit under tests; and means for accepting measurement of the results of said functional test.

110. The apparatus of claim 107 wherein said means for causing comprises:

means for directing automatic test equipment to perform a functional test on said unit under test; and means for accepting the results of said functional test from said automatic test equipment.

111. A computer system for characterizing an electronic unit comprising a plurality of interconnected electronic circuit components, said computer system comprising:

a circuit knowledge base;

an electronics knowledge base containing models of common electronic circuit components, said models comprising all of phase, gain and compliance limits; and a knowledge acquisition module connected to said circuit knowledge base and said electronics knowledge base, said knowledge acquisition module comprising:

means for acquiring a representation of a schematic diagram of said electronic unit and placing said schematic diagram representation in said circuit knowledge base;

means for generating a hierarchical decomposition of said electronic unit, said hierarchical decomposition comprising a plurality of blocks each of which includes at least one input and at least one output, said plurality of blocks being organized in a plurality of functional abstraction levels from low to high, the blocks in said lowest functional abstraction level corresponding to a respective one of said electronic circuit components, each higher functional abstraction level block including at least one next lower functional abstraction level block, each of said plurality of blocks corresponding to a model in said electronics database; and, means for placing said hierarchical decomposition in said circuit knowledge base.

112. The system of claim 111 wherein said knowledge acquisition module further comprises:

means for acquiring a representation of a test plan for said electronic unit and placing said representation of said test plan in said circuit knowledge base.

113. A computer system for troubleshooting an electronic unit comprising a plurality of interconnected electronic circuit components, said computer system comprising:
- a circuit knowledge base, containing a hierarchical decomposition of said unit under test into a plurality of functional abstraction levels;
- an electronics knowledge base containing models of common electronic circuit components, said models comprising all of phase, gain and compliance limits; and
- a troubleshooting module comprising:
    - means for storing in said circuit knowledge base a predetermined search strategy for searching said hierarchical decomposition;
    - means for searching said hierarchical decomposition pursuant to said search strategy; and
    - means for comparing measurements of said electronic circuit components with said models in said electronics knowledge base, to thereby identify a faulty one of said electronic circuit components.

114. The system of claim 113 wherein said circuit knowledge base further contains a representation of a test plan for said electronic unit, and wherein said means for searching further comprises:
- means for causing said test plan to be executed until a failed test is detected; and
- means for initiating searching said hierarchical decomposition at a functional abstraction level corresponding to said failed test.

* * * * *

UNITED STATES PATENT AND TRADEMARK OFFICE
CERTIFICATE OF CORRECTION

PATENT NO. : 5,157,668

DATED : October 20, 1992

INVENTOR(S) : Buenzli, Jr. et al.

It is certified that error appears in the above-identified patent and that said Letters Patent is hereby corrected as shown below:

Title page, item [56]
In REFERENCES CITED:

"4,591,938" should be --4,591,983--.

"Dunlop" should be --Dunlop et al.--.

Title page, after Reference Cited
In OTHER PUBLICATIONS:

line 4, "Oliver" should be --Olivier--.

line 7, "Olier" should be --Olivier--.

line 10 and 11, after "Guided Search", insert --,--.

Col. 1, line 4, "Solution" should be --Solutions--.

Col. 2, line 2, after "Milne" please insert --,--.

Col. 2, line 3, after "Village" please insert --,--.

Column 3, line 18, "Electonique" should be --Electronique--.

Column 3, line 23, "Modelling" should be --Modeling--.

Column 5, line 50, "$\leq$" should be --$\leq$-- (two occurrences.

UNITED STATES PATENT AND TRADEMARK OFFICE
CERTIFICATE OF CORRECTION

PATENT NO. : 5,157,668  
DATED : October 20, 1992  
INVENTOR(S) : Buenzli, Jr. et al.

Page 2 of 4

It is certified that error appears in the above-identified patent and that said Letters Patent is hereby corrected as shown below:

Column 6, line 28, "is" should be --has--.

Column 6, line 32, "an" should be --a--.

Column 8, line 13, "illustrates" should be --illustrate--.

Column 8, before line 40, please insert sub-heading:

--System Overview--

Column 9, line 13, "con roller" should be --controller--.

Column 9, line 39, after "CAE", please insert: --tools and a circuit mapper to link the unit's schematic with--.

Column 12, line 41, "an" should be --and--.

Column 13, line 8, "an" should be --a--.

Column 13, line 17, "an" should be --a--.

Column 13, line 30, "an" should be --a--.

Column 13, line 33, "modules" should be --module's--.

UNITED STATES PATENT AND TRADEMARK OFFICE
CERTIFICATE OF CORRECTION

PATENT NO. : 5,157,668
DATED : October 20, 1992
INVENTOR(S) : Buenzli, Jr. et al.

It is certified that error appears in the above-identified patent and that said Letters Patent is hereby corrected as shown below:

Column 13, line 63, after "switches", please insert --,--.

Column 14, line 35, "The" should be --They--.

Column 16, line 16 "(Block" should be --(Block 62).--.

Column 17, line 9, ">" should be --<--. (second occurrence)

Column 17, line 66, "insure" should be --ensure--.

Column 18, line 23, after "is" please insert --a--.

Column 21, line 50, after "be" please insert --a--.

Column 21, line 51, "plane" should be --plan--.

Column 22, line 22, "LRUs" should be --LRU's--.

Column 22, line 23, "LRUs" should be --LRU's--.

Column 22, line 27, "LRUs" should be --LRU's--.

Column 26, line 8, after "in" (second occurrence), please insert --a--.

Column 27, line 56, "wherein put" should be --where input--.

UNITED STATES PATENT AND TRADEMARK OFFICE
CERTIFICATE OF CORRECTION

PATENT NO. : 5,157,668
DATED : October 20, 1992
INVENTOR(S) : Buenzli, Jr. et al.

It is certified that error appears in the above-identified patent and that said Letters Patent is hereby corrected as shown below:

Column 28, line 50, please delete "the".

Column 34, line 32, "form" should be --from--.

Column 35, line 14, after "which", please insert --includes--.

Signed and Sealed this

Thirtieth Day of November, 1993

Attest:

BRUCE LEHMAN

Attesting Officer

Commissioner of Patents and Trademarks